(12) United States Patent
Reiha

(10) Patent No.: US 9,128,177 B2
(45) Date of Patent: Sep. 8, 2015

(54) BAND GROUPING COMBINATIONS FOR TUNABLE UMTS MULTI-BAND FILTERS

(71) Applicant: Nokia Corporation, Espoo (FI)

(72) Inventor: Michael Reiha, El Cerrito, CA (US)

(73) Assignee: Nokia Technologies Oy, Espoo (FI)

( * ) Notice: Subject to any disclaimer, the term of this patent is extended or adjusted under 35 U.S.C. 154(b) by 133 days.

(21) Appl. No.: 13/904,131

(22) Filed: May 29, 2013

(65) Prior Publication Data

US 2014/0355497 A1    Dec. 4, 2014

(51) Int. Cl.
| | |
|---|---|
| H01Q 5/00 | (2015.01) |
| G01S 19/13 | (2010.01) |
| H01Q 1/24 | (2006.01) |
| H04B 1/00 | (2006.01) |
| G01S 19/14 | (2010.01) |

(52) U.S. Cl.
CPC ............... *G01S 19/13* (2013.01); *H01Q 1/246* (2013.01); *H01Q 5/0093* (2013.01); *H04B 1/0064* (2013.01); *G01S 19/14* (2013.01)

(58) Field of Classification Search
CPC ....................................................... H04L 5/14
USPC ......................................................... 370/281
See application file for complete search history.

(56) References Cited

U.S. PATENT DOCUMENTS

| | | | |
|---|---|---|---|
| 5,227,748 A | 7/1993 | Sroka | |
| 7,212,789 B2 | 5/2007 | Kuffner | |
| 7,340,280 B2 | 3/2008 | Niemela et al. | |
| 8,339,216 B2 | 12/2012 | Kenington | |
| 2007/0035356 A1 | 2/2007 | Ranta | |
| 2011/0134810 A1 | 6/2011 | Yamamoto et al. | |
| 2012/0034917 A1 | 2/2012 | Kazmi | |
| 2012/0112853 A1* | 5/2012 | Hikino et al. | 333/132 |
| 2012/0243446 A1* | 9/2012 | Mueller et al. | 370/280 |

OTHER PUBLICATIONS

R. Cameron; General Coupling Matrix Synthesis Methods for Chebyshev Filtering Functions; IEEE Transactions on Microwave Theory and Techniques, vol. 47, No. 4, Apr. 1999, pp. 433-442.
International Search Report for International Application No. PCT/FI2014/050400 mailed Sep. 22, 2014.

\* cited by examiner

*Primary Examiner* — Dang Ton
*Assistant Examiner* — Mewale Ambaye
(74) *Attorney, Agent, or Firm* — Locke Lord LLP

(57) ABSTRACT

Apparatus, method, and system example embodiments provide an improved RF front end to simultaneously transmit and receive signals for cellular telecommunications. In an example embodiment, an apparatus comprises a tunable duplexer selectively connected to an antenna, configured to transmit and receive radio frequency communication signals in a group of at least two bands; and a tunable transmit filter in the duplexer, capable of being tuned to have an inductance value approximately matching at least two inductance values corresponding respectively to pass the at least two bands in the group, each of the at least two bands in the group having a positive duplex offset and each of the at least two inductance values that correspond respectively to the at least two bands in the group, having an inductance value that approximately matches the inductance values corresponding respectively to the other bands in the group.

18 Claims, 13 Drawing Sheets

STEP 902: DETERMINING, BY AN APPARATUS, THAT A FIRST PLURALITY OF BANDS OF RADIO FREQUENCY COMMUNICATION AND A SECOND PLURALITY OF BANDS OF RADIO FREQUENCY COMMUNICATION ARE AVAILABLE FOR WIRELESS COMMUNICATION IN A CURRENT GEOGRAPHICAL REGION;

→

STEP 904: DETERMINING, BY THE APPARATUS, THAT COMMUNICATION SIGNALS OF AT LEAST TWO BANDS OF THE FIRST PLURALITY OF BANDS, ARE CAPABLE OF BEING PASSED BY A TUNABLE TRANSMIT FILTER OF A FIRST TUNABLE DUPLEXER, BASED ON THE TUNABLE TRANSMIT FILTER BEING TUNED TO HAVE AN INDUCTANCE VALUE APPROXIMATELY MATCHING AT LEAST TWO INDUCTANCE VALUES CORRESPONDING RESPECTIVELY TO THE AT LEAST TWO BANDS OF THE FIRST PLURALITY;

→

STEP 906: DETERMINING, BY THE APPARATUS, THAT COMMUNICATION SIGNALS OF AT LEAST TWO BANDS OF THE SECOND PLURALITY OF BANDS, ARE CAPABLE OF BEING PASSED BY A SECOND TUNABLE TRANSMIT FILTER OF A SECOND TUNABLE DUPLEXER, BASED ON THE SECOND TUNABLE TRANSMIT FILTER BEING TUNED TO HAVE AN INDUCTANCE VALUE APPROXIMATELY MATCHING AT LEAST TWO INDUCTANCE VALUES CORRESPONDING RESPECTIVELY TO THE AT LEAST TWO BANDS OF THE SECOND PLURALITY; AND

→

STEP 908: CONNECTING, BY THE APPARATUS, THE AT LEAST TWO BANDS OF THE FIRST PLURALITY OF BANDS, TO THE FIRST TUNABLE DUPLEXER AND THE AT LEAST TWO BANDS OF THE SECOND PLURALITY OF BANDS, TO THE SECOND TUNABLE DUPLEXER.

BAND GROUPING COMBINATIONS FOR TUNABLE UMTS MULTI-BAND FILTERS

FIELD

The field of the invention relates to radio frequency circuits used in cellular telecommunications systems.

BACKGROUND

The Universal Mobile Telecommunications System (UMTS) has been a major Third Generation (3G) technology standard for cellular telecommunications. The UMTS cellular technology has been upgraded as the Fourth Generation (4G) Long Term Evolution (LTE) system that enables much higher speeds to be achieved for cellular communications, with lower packet latency. The number of UMTS bands that may be supported by 4G-LTE frequency division duplex (FDD) cellular telephone device is increasing. For example, it is projected that 29 FDD single-carrier bands may be supported, in tandem with a projected value of 25 carrier aggregation band combinations. Current RF front-end filter technologies can only support one single-carrier band per filter count. As a result, a typical 4G-LTE FDD cellular telephone handset may only support a fraction of the total number of bands. Furthermore, a typical 4G-LTE FDD handset may be manufactured to service a particular geographical region, thus creating a disjoint in the global supply chain for OEMs.

SUMMARY

Apparatus, method, and system example embodiments provide an improved RF front end to simultaneously transmit and receive signals for cellular telecommunications.

An example embodiment of the invention includes an apparatus comprising:

a tunable duplexer selectively connected to an antenna, configured to transmit and receive radio frequency communication signals in a group of at least two bands; and a tunable transmit filter in the duplexer, capable of being tuned to have an inductance value approximately matching at least two inductance values corresponding respectively to pass the at least two bands in the group, each of the at least two bands in the group having a positive duplex offset and each of the at least two inductance values that correspond respectively to the at least two bands in the group, having an inductance value that approximately matches the inductance values corresponding respectively to the other bands in the group.

An example embodiment of the invention includes an apparatus comprising:

a tunable receive filter in the duplexer, capable of being tuned to have an inductance value approximately matching at least two inductance values corresponding respectively to pass receive frequency signals of the at least two bands in the group.

An example embodiment of the invention includes an apparatus comprising:

a second tunable duplexer selectively connected to the antenna, configured to transmit and receive radio frequency communication signals in a second group of at least two bands, the second duplexer comprising a tunable transmit filter capable of being tuned to have an inductance value approximately matching at least two inductance values corresponding respectively to pass the at least two bands in the second group, each of the at least two bands in the second group having a positive duplex offset and each of the at least two inductance values that correspond respectively to the at least two bands in the second group, having a higher inductance value than the inductance value in the first said group, which approximately matches the inductance values corresponding respectively to the other bands in the second group.

An example embodiment of the invention includes an apparatus comprising:

a tunable receive filter in the second duplexer, capable of being tuned to have an inductance value approximately matching at least two inductance values corresponding respectively to pass receive frequency signals of the at least two bands in the second group.

An example embodiment of the invention includes an apparatus comprising:

a third tunable duplexer selectively connected to the antenna, configured to transmit and receive radio frequency communication signals in a third group of at least two bands having a negative duplex offset.

An example embodiment of the invention includes an apparatus comprising:

a tunable transmit filter in the third duplexer, capable of being tuned to have an inductance value approximately matching at least two inductance values corresponding respectively to pass the at least two bands in the third group; and a tunable receive filter in the third duplexer, capable of being tuned to have an inductance value approximately matching at least two inductance values corresponding respectively to pass receive frequency signals of the at least two bands in the third group.

An example embodiment of the invention includes an apparatus comprising:

wherein the tunable duplexer is selectively connected to a high-band antenna, configured to transmit and receive high-band radio frequency communication signals in the group of at least two bands, and each of the at least two inductance values that correspond respectively to the at least two bands in the group, having a lower inductance value that approximately matches the inductance values corresponding respectively to the other bands in the group; and a second tunable duplexer selectively connected to the high-band antenna, configured to transmit and receive high-band radio frequency communication signals in a second group of at least two bands, the second duplexer comprising a tunable transmit filter capable of being tuned to have an inductance value approximately matching at least two inductance values corresponding respectively to pass the at least two bands in the second group, each of the at least two bands in the second group having a positive duplex offset and each of the at least two inductance values that correspond respectively to the at least two bands in the second group, having a higher inductance value than the lower inductance value in the first said group, which approximately matches the inductance values corresponding respectively to the other bands in the second group.

An example embodiment of the invention includes an apparatus comprising:

a third tunable duplexer selectively connected to a low-band antenna that is a lower-band antenna than the high-band antenna, configured to transmit and receive low-band radio frequency communication signals in a third group of at least two bands, the third duplexer comprising a tunable transmit filter capable of being tuned to have an inductance value approximately matching at least two inductance values corresponding respectively to pass the at least two bands in the third group, each of the at least two bands in the third group having a positive duplex offset and each of the at least two inductance values that correspond respectively to the at least two bands in the third group, having a lower inductance value that approximately matches the inductance values corresponding respectively to the other bands in the third group;

An example embodiment of the invention includes an apparatus comprising:

a fourth tunable duplexer selectively connected to the low-band antenna, configured to transmit and receive low-band radio frequency communication signals in a fourth group of at least two bands, the fourth duplexer comprising a tunable transmit filter capable of being tuned to have an inductance value approximately matching at least two inductance values corresponding respectively to pass the at least two bands in the fourth group, each of the at least two bands in the fourth group having a positive duplex offset and each of the at least two inductance values that correspond respectively to the at least two bands in the fourth group, having a higher inductance value than the lower inductance value in the third group, which approximately matches the inductance values corresponding respectively to the other bands in the fourth group.

An example embodiment of the invention includes an apparatus comprising:

a fifth tunable duplexer selectively connected to the low-band antenna, configured to transmit and receive radio frequency communication signals in a fifth group of at least one band having a negative duplex offset.

An example embodiment of the invention includes an apparatus comprising:

a transceiver having at least one tunable broadband I/O port coupled to the tunable duplexer.

An example embodiment of the invention includes an apparatus comprising:

a switch matrix coupled to the tunable duplexer; and a broad-band tunable transceiver having single-port coupled to the switch matrix.

An example embodiment of the invention includes an apparatus comprising:

wherein the bands are Universal Mobile Telecommunications System (UMTS) frequency division duplex (FDD) communication bands in a cellular telecommunications network.

An example embodiment of the invention includes an apparatus comprising:

wherein the bands are Long Term Evolution (LTE) frequency division duplex (FDD) communication bands in a cellular telecommunications network.

An example embodiment of the invention includes an apparatus comprising:

wherein the apparatus is a cellular telephone handset configured to operate in diverse geographical regions having diverse communication bands available.

An example embodiment of the invention includes an apparatus comprising:

wherein the apparatus is a cellular telephone base station configured to operate in diverse geographical regions having diverse communication bands available.

An example embodiment of the invention includes an apparatus comprising:

a location determination module in the apparatus, configured to determine a current geographical region for the apparatus, in which regional radio frequency communication bands are known to be available in the current geographical region; and a processor in the apparatus, coupled to the location determination module and the tunable duplexer, configured to provide control signals to adjust band pass characteristics of at least the tunable transmit filter in the tunable duplexer, based on the regional radio frequency communication bands known to be available in the determined current geographical region.

An example embodiment of the invention includes an apparatus comprising:

wherein the location determination module in the apparatus, is at least one of a user interface or a global position system (GPS) receiver, configured to receive data identifying a current geographical region for the apparatus.

An example embodiment of the invention includes an apparatus comprising:

wherein the processor in the apparatus, is configured to download current geographical region data and the known available regional radio frequency communication bands from a remote server.

An example embodiment of the invention includes a method comprising:

determining, by an apparatus, that a first plurality of bands of radio frequency communication and a second plurality of bands of radio frequency communication are available for wireless communication in a current geographical region;

determining, by the apparatus, that communication signals of at least two bands of the first plurality of bands, are capable of being passed by a tunable transmit filter of a first tunable duplexer, based on the tunable transmit filter being tuned to have an inductance value approximately matching at least two inductance values corresponding respectively to the at least two bands of the first plurality;

determining, by the apparatus, that communication signals of at least two bands of the second plurality of bands, are capable of being passed by a second tunable transmit filter of a second tunable duplexer, based on the second tunable transmit filter being tuned to have an inductance value approximately matching at least two inductance values corresponding respectively to the at least two bands of the second plurality; and connecting, by the apparatus, the at least two bands of the first plurality of bands, to the first tunable duplexer and the at least two bands of the second plurality of bands, to the second tunable duplexer.

An example embodiment of the invention includes a method comprising:

wherein the bands are at lest one of Universal Mobile Telecommunications System (UMTS) frequency division duplex (FDD) communication bands and Long Term Evolution (LTE) frequency division duplex (FDD) communication bands in a cellular telecommunications network.

An example embodiment of the invention includes a method comprising:

wherein the apparatus is a cellular telephone handset configured to operate in diverse geographical regions having diverse communication bands available.

An example embodiment of the invention includes an apparatus comprising:

at least one processor;

at least one memory including computer program code;

the at least one memory and the computer program code configured to, with the at least one processor, cause the apparatus at least to:

determine that a first plurality of bands of radio frequency communication and a second plurality of bands of radio frequency communication are available for wireless communication in a current geographical region;

determine that communication signals of at least two bands of the first plurality of bands, are capable of being passed by a tunable transmit filter of a first tunable duplexer, based on the tunable transmit filter being tuned to have an inductance value approximately matching at least two inductance values corresponding respectively to the at least two bands of the first plurality;

determine that communication signals of at least two bands of the second plurality of bands, are capable of being passed by a second tunable transmit filter of a second tunable duplexer, based on the second tunable transmit filter being tuned to have an inductance value approximately matching at least two inductance values corresponding respectively to the at least two bands of the second plurality; and connect the at least two bands of the first plurality of bands, to the first tunable duplexer and the at least two bands of the second plurality of bands, to the second tunable duplexer.

An example embodiment of the invention includes a computer program product comprising computer executable program code recorded on a computer readable, non-transitory storage medium, the computer executable program code comprising:

code for determining, by an apparatus, that a first plurality of bands of radio frequency communication and a second plurality of bands of radio frequency communication are available for wireless communication in a current geographical region;

code for determining, by the apparatus, that communication signals of at least two bands of the first plurality of bands, are capable of being passed by a tunable transmit filter of a first tunable duplexer, based on the tunable transmit filter being tuned to have an inductance value approximately matching at least two inductance values corresponding respectively to the at least two bands of the first plurality;

code for determining, by the apparatus, that communication signals of at least two bands of the second plurality of bands, are capable of being passed by a second tunable transmit filter of a second tunable duplexer, based on the second tunable transmit filter being tuned to have an inductance value approximately matching at least two inductance values corresponding respectively to the at least two bands of the second plurality; and code for connecting, by the apparatus, the at least two bands of the first plurality of bands, to the first tunable duplexer and the at least two bands of the second plurality of bands, to the second tunable duplexer for wireless communication by the apparatus in the current geographical region.

DESCRIPTION OF THE FIGURES

FIG. 9 is an example flow diagram of operational steps in the mobile telephone, according to an example embodiment of the invention.

DISCUSSION OF EXAMPLE EMBODIMENTS OF THE INVENTION

In an example embodiment of the invention, combinations of UMTS bands are grouped in a multi-band tunable filter. The resulting band combinations are represented by a total of five tunable filters that enable manufacturing 4G-LTE FDD communication devices that are not geographically restricted.

Figure 1A:
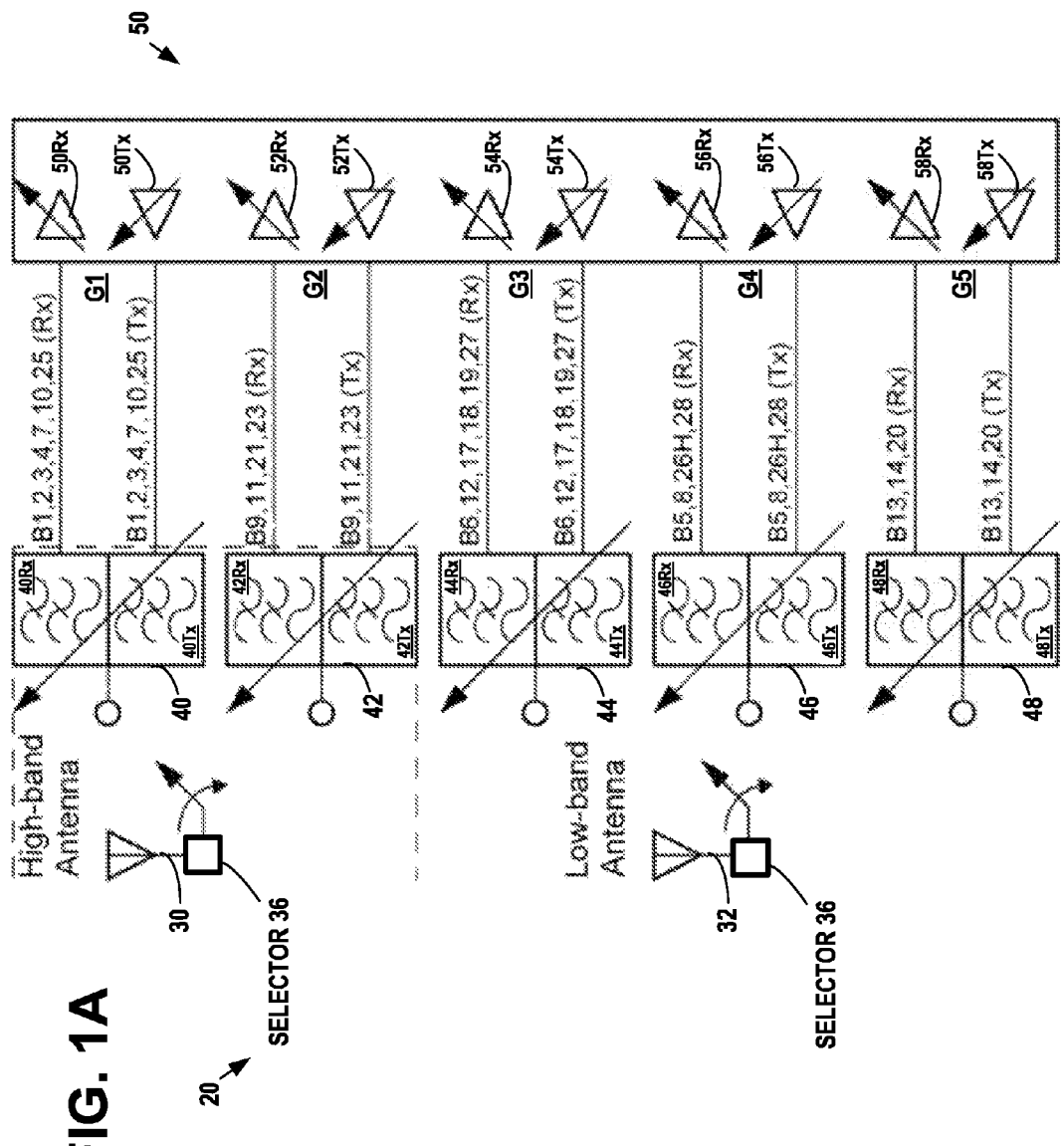
FIG. 1A is an illustration of an example embodiment of the invention, depicting a tunable RF front-end with five tunable duplexers that cover one or more UMTS FDD bands, interfaced to a transceiver with five tunable broadband I/O ports, in accordance with an example embodiment of the invention.

FIG. 1A is an illustration of an example embodiment of the invention, depicting a tunable RF front-end 20 with five tunable duplexers 40, 42, 44, 46, and 48 that may cover one or more UMTS FDD bands, interfaced to a transceiver 50 with five tunable broadband I/O ports including 50Rx and 50Tx, in accordance with an example embodiment of the invention. A duplexer, for example 40, may allow a transmitter operating on one frequency and a receiver operating on a different frequency to share one common antenna with a minimum of interaction and degradation of the different RF signals. Table 7 lists the frequencies corresponding to the UMTS FDD band numbers 1 through 29.

In accordance with an example embodiment of the invention, a first tunable duplexer 40 may be selectively connected by selector 36 to a high-band antenna 30, configured to transmit and receive high-band radio frequency communication signals in a first group G1 of at least two bands B1, B2, B3, B4, B7, B10, and B25. In accordance with an example embodiment of the invention, transmit center frequencies greater than 1400 MHz are grouped as high-band while transmit center frequencies less than 900 MHz are grouped as low-band.

In accordance with an example embodiment of the invention, the first duplexer 40 may comprise a tunable transmit filter 40Tx capable of being tuned to have an inductance value approximately matching at least two inductance values L1, L2, etc. corresponding respectively to pass the at least two bands B1, B2, etc. in the first group G1. The inductance values L1, L2, etc. are based upon coefficients generated from the generalized coupling matrix, frequency invariant susceptance, B, center frequency and fractional bandwidth, $f_0$, FBW, and external quality factor, $Q_{ext}$. The generalized coupling matrix is described in the publication by R. J. Cameron, "General coupling matrix synthesis methods for Chebyshev filtering functions", *IEEE Trans. Microwave Theory Tech.*, vol 47, pp. 433-442, April 1999, incorporated herein by reference.

In accordance with an example embodiment of the invention, frequency invariant susceptance, B, appears in cross-coupled bandpass filters and its operation is to asynchronously tune the resonators of the filter. In synchronously tuned resonators, for example, the value is B=0. The asynchronously (or synchronously) tuned center frequency $f_1$ of the resonators adjacent to the source or load impedances warrants a capacitance value $C_1$ that resonates with a user-defined shunt inductance $L_0$. The external quality factor $Q_{ext}$ of the filter, $$Q_{ext}=1/(m_{01}^2 \times FBW), \quad (1)$$

relates the $m_{01}$ (i.e., $m_S$ or $m_L$) entry of the generalized coupling matrix to FBW. A matching capacitor $C_{01}$ can be derived as, $$C_{01}=[C_1/(Z_0 \times Q_{ext} \times FBW)]^{1/2}, \quad (2)$$

and the matching inductance $L_{01}$, for example, the inductance value L1, L2, etc., is related as, $$L_{01}=1/[C_{01} \times (2\pi f_1)2]. \quad (3)$$

For example, if the tunable transmit filter 40Tx is capable of being tuned so that the $L_{01}$ inductance value enables passing Tx signals in the B1 band, then the B1 band may be grouped in the first group G1. For convenience, $L_{01}$ is referred to as the L1 inductance value.

In accordance with an example embodiment of the invention, each of the at least two bands B1, B2, etc. in the first group G1 may have a positive duplex offset. Duplexers with a negative duplex frequency offset (e.g., $f_{RX}-f_{TX}<0$) are grouped in their own duplexer class. The at least two inductance values L1, L2, etc. may correspond respectively to the at least two bands B1, B2, etc. in the first group G1, having a lower inductance value that approximately matches the inductance values corresponding respectively to the other bands in the first group G1. The first duplexer 40 may also comprise a tunable receive filter 40Rx.

In accordance with an example embodiment of the invention, a second tunable duplexer 42 may be selectively connected by selector 36 to the high-band antenna 30, configured to transmit and receive high-band radio frequency communication signals in a second group G2 of at least two bands B9, B11, B21, and B23. The second duplexer 42 may comprise a tunable transmit filter 42Tx capable of being tuned to have an inductance value approximately matching at least two inductance values L9, L11, etc. corresponding respectively to pass the at least two bands B9, B11, etc. in the second group G2. The inductance values L9, L11, etc. may be determined in the same manner as described above for L1, L2, etc. in the first duplexer 40. The second duplexer 42 may also comprise a tunable receive filter 42Rx. Each of the at least two bands B9, B11, etc. in the second group G2 may have a positive duplex offset. The at least two inductance values L9, L11, etc. may correspond respectively to the at least two bands B9, B11, etc. in the second group G2, having a higher inductance value than the lower inductance value in the first group G1, which approximately matches the inductance values corresponding respectively to the other bands in the second group G2.

In accordance with an example embodiment of the invention, a third tunable duplexer 44 may be selectively connected by selector 36 to a low-band antenna 32 that is a lower-band antenna than the high-band antenna 30, configured to transmit and receive low-band radio frequency communication signals in a third group G3 of at least two bands B6, B12, B17, B18, B19, and B27. The third duplexer 44 may comprise a tunable transmit filter 44Tx capable of being tuned to have an inductance value approximately matching at least two inductance values L6, L12, etc. corresponding respectively to pass the at least two bands B6, B12, etc. in the third group G3. The inductance values L6, L12, etc. may be determined in the same manner as described above for L1, L2, etc. in the first duplexer 40. The third duplexer 44 may also comprise a tunable receive filter 44Rx. Each of the at least two bands B6, B12, etc. in the third group G3 may have a positive duplex offset. The at least two inductance values L6, L12, etc. may correspond respectively to the at least two bands B6, B12, etc. in the third group G3, having a lower inductance value that approximately matches the inductance values corresponding respectively to the other bands in the third group G3.

In accordance with an example embodiment of the invention, a fourth tunable duplexer 46 may be selectively connected by selector 36 to the low-band antenna 32, configured to transmit and receive low-band radio frequency communication signals in a fourth group G4 of at least two bands B5, B8, B26H, and B28. The fourth duplexer 46 may comprise a tunable transmit filter 46Tx capable of being tuned to have an inductance value approximately matching at least two inductance values L5, L8, etc. corresponding respectively to pass the at least two bands B5, B8, etc. in the fourth group G4. The inductance values L5, L8, etc. may be determined in the same manner as described above for L1, L2, etc. in the first duplexer 40. The fourth duplexer 46 may also comprise a tunable receive filter 46Rx. Each of the at least two bands B5, B8, etc. in the fourth group G4 may have a positive duplex offset. The at least two inductance values L5, L8, etc. may correspond respectively to the at least two bands B5, B8, etc. in the fourth group G4, having a higher inductance value than the lower inductance value in the third group G3, which approximately matches the inductance values corresponding respectively to the other bands in the fourth group G4.

In accordance with an example embodiment of the invention, a fifth tunable duplexer 48 may be selectively connected by selector 36 to the low-band antenna 32, configured to transmit and receive radio frequency communication signals in a fifth group G5 of at least one band B13, B14, and B20 having a negative duplex offset. Duplexers with a negative duplex frequency offset (e.g., $f_{RX}-f_{TX}<0$) are grouped in their own duplexer class.

In accordance with an example embodiment of the invention, the five tunable duplexers 40, 42, 44, 46, and 48 may be selectively connected by the selector 36 to the antennas 30, 32, and/or 34, to cover a fraction of the total number of UMTS FDD bands, which may be locally available in a current geographical location. In accordance with an example embodiment of the invention, a communications device, such as a mobile phone, that includes the five tunable duplexers 40, 42, 44, 46, and 48, is not geographically restricted by locally available UMTS FDD bands.

In accordance with an example embodiment of the invention, a communications device, such as a mobile phone, may determine that a first group G1 of UMTS FDD bands and a second group G2 of UMTS FDD bands are available for wireless communication in a current geographical region. The first group G1 of UMTS FDD bands B1, B2, B3, B4, B7, B10, and B25 may be determined to be capable of being passed by the first tunable duplexer 40. The second group G2 of UMTS FDD bands B9, B11, B21, and B23 may be determined to be capable of being passed by the second tunable duplexer 42. In accordance with an example embodiment of the invention, the tunable duplexers 40 and 42 may be selectively connected by the selector 36 to the antenna 30 to cover the UMTS FDD bands in groups G1 and G2, which may be locally available in a current geographical location.

In accordance with an example embodiment of the invention, a transceiver 50 having five tunable broadband I/O ports 50Rx/50Tx, 52Rx/52Tx, 54Rx/54Tx, 56Rx/56Tx, and 58Rx/58Tx, may have each I/O port coupled to a respective one of the first, second, third, fourth, and fifth tunable duplexers 40, 42, 44, 46, and 48.

In accordance with an example embodiment of the invention, the bands B1 to B28 may be Universal Mobile Telecommunications System (UMTS) frequency division duplex (FDD) communication bands in a cellular telecommunications network.

In accordance with an example embodiment of the invention, the bands B1 to B28 may be Long Term Evolution (LTE) frequency division duplex (FDD) communication bands in a cellular telecommunications network.

In accordance with an example embodiment of the invention, the apparatus may a cellular telephone handset configured to operate in diverse geographical regions having diverse communication bands available.

In accordance with an example embodiment of the invention, the apparatus may be a cellular telephone base station configured to operate in diverse geographical regions having diverse communication bands available.

Figure 1B:
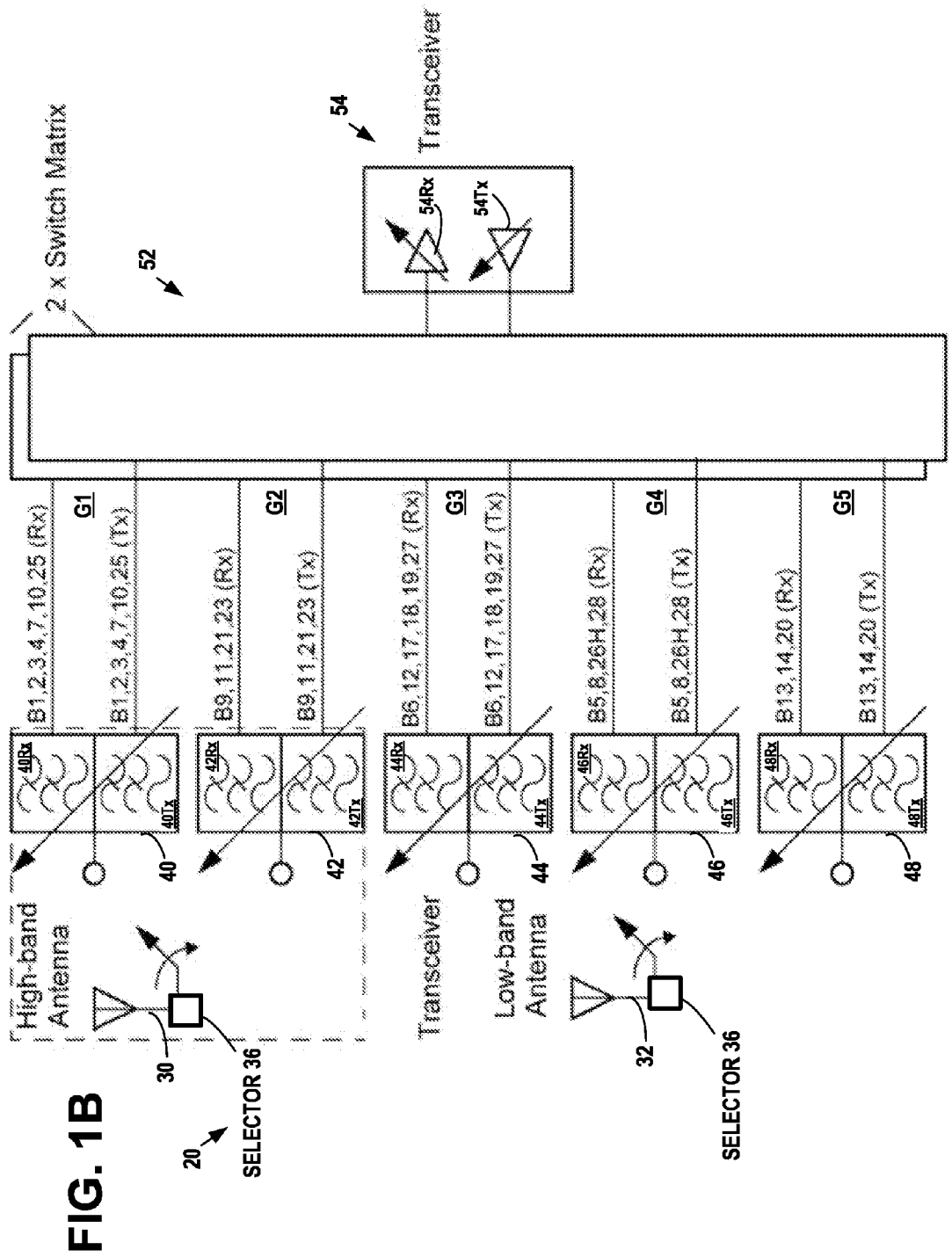
FIG. 1B is an illustration of an example embodiment of the invention, depicting a tunable RF front-end with five tunable duplexers that cover one or more UMTS FDD bands, interfaced to a broad-band single-port tunable transceiver, through two 5-to-1 switch matrices, in accordance with an example embodiment of the invention.

FIG. 1B is an illustration of an example embodiment of the invention, depicting a tunable RF front-end 20 with five tunable duplexers 40, 42, 44, 46, and 48 described for FIG. 1A, that cover one or more UMTS FDD bands, interfaced to a broad-band single-port tunable transceiver 54, through two 5-to-1 switch matrices 52, in accordance with an example embodiment of the invention. In accordance with an example embodiment of the invention, a switch matrix 52 may be coupled to each of the first, second, third, fourth, and fifth tunable duplexers 40, 42, 44, 46, and 48. A broad-band tunable transceiver 54 having single-port 54Rx/54Tx may be selectively coupled to the switch matrix 52 by the selector 36.

Figure 1C:
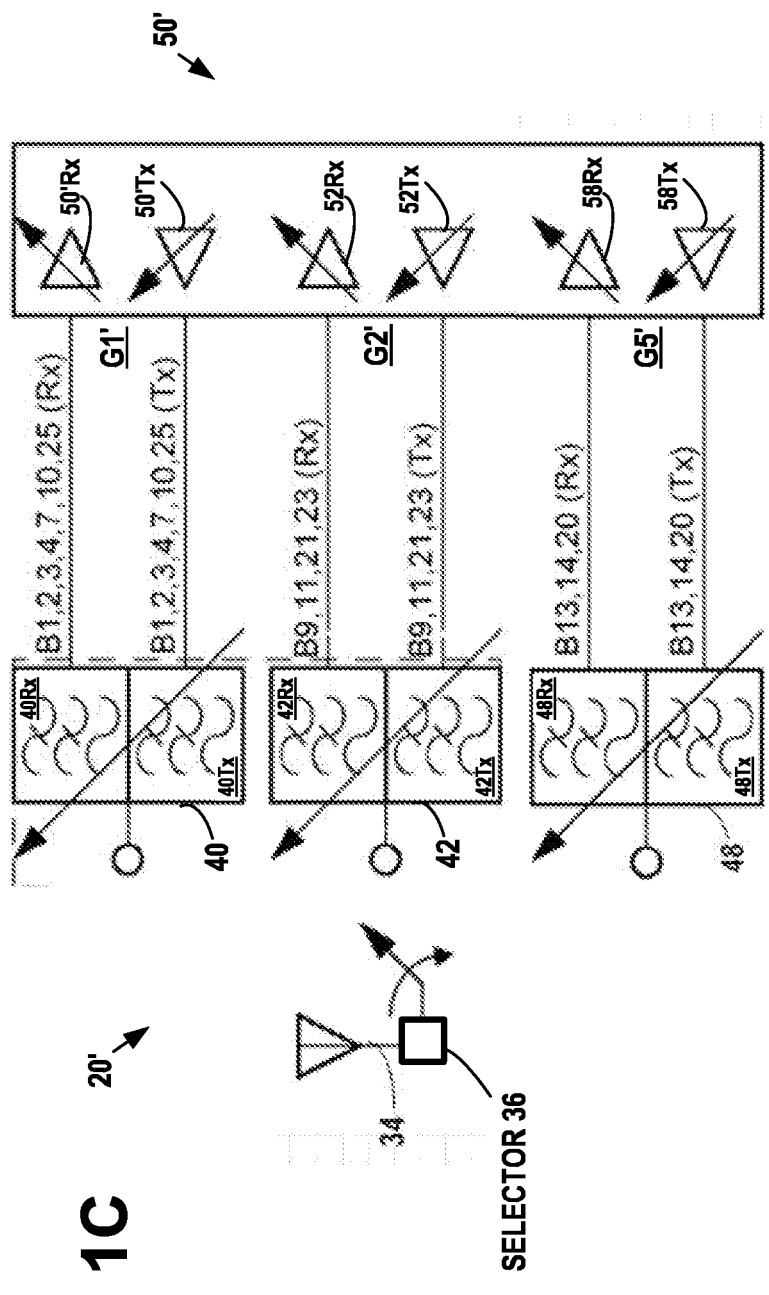
FIG. 1C is an illustration of an example embodiment of the invention, depicting a tunable RF front-end with three tunable duplexers selectively connected to a single antenna, which cover one or more UMTS FDD bands, interfaced to a transceiver with the tunable broadband I/O ports, in accordance with an example embodiment of the invention.

FIG. 1C is an illustration of an example embodiment of the invention, depicting a tunable RF front-end 20' with three tunable duplexers 40, 42, and 48 selectively connected by selector 36 to a single antenna 34, which cover one or more UMTS FDD bands, interfaced to a transceiver 50' with the tunable broadband I/O ports 50Rx/50Tx, 52Rx/52Tx, and 58Rx/58Tx, in accordance with an example embodiment of the invention.

In accordance with an example embodiment of the invention, the first tunable duplexer 40 selectively connected by selector 36 to the antenna 34, configured to transmit and receive radio frequency communication signals in a first group G1' of at least two bands B1, B2, B3, B4, B7, B10, and B25 and also B6, B12, B17, B18, B19, and B27. The first duplexer 40 may comprise a tunable transmit filter 40Tx capable of being tuned to have an inductance value approximately matching at least two inductance values L1, L2, etc. corresponding respectively to pass the at least two bands B1, B2, etc. in the first group G1', each of the at least two bands B1, B2, etc. in the first group G1' having a positive duplex offset. The at least two inductance values L1, L2, etc. corresponding respectively to the at least two bands B1, B2, etc. in the first group G1', having a lower inductance value that approximately matches the inductance values corresponding respectively to the other bands in the first group G1'.

In accordance with an example embodiment of the invention, the second tunable duplexer 42 selectively connected by selector 36 to the same antenna 34, configured to transmit and receive radio frequency communication signals in a second group G2' of at least two bands B9, B11, B21, and B23 and also B5, B8, B26H, and B28. The second duplexer 42 may comprise a tunable transmit filter 42Tx capable of being tuned to have an inductance value approximately matching at least two inductance values L9, L11, etc. corresponding respectively to pass the at least two bands B9, B11, etc. in the second group G2', each of the at least two bands B9, B11, etc. in the second group G2' having a positive duplex offset. The at least two inductance values L9, L11, etc. corresponding respectively to the at least two bands B9, B11, etc. in the second group G2', having a higher inductance value than the lower inductance value in the first group G1', which approximately matches the inductance values corresponding respectively to the other bands in the second group G2'.

In accordance with an example embodiment of the invention, the third tunable duplexer 48 selectively by selector 36 connected to the same antenna 34, may be configured to transmit and receive radio frequency communication signals in a third group G3' of at least one band B13, B14, and B20 having a negative duplex offset.

Figure 1D:
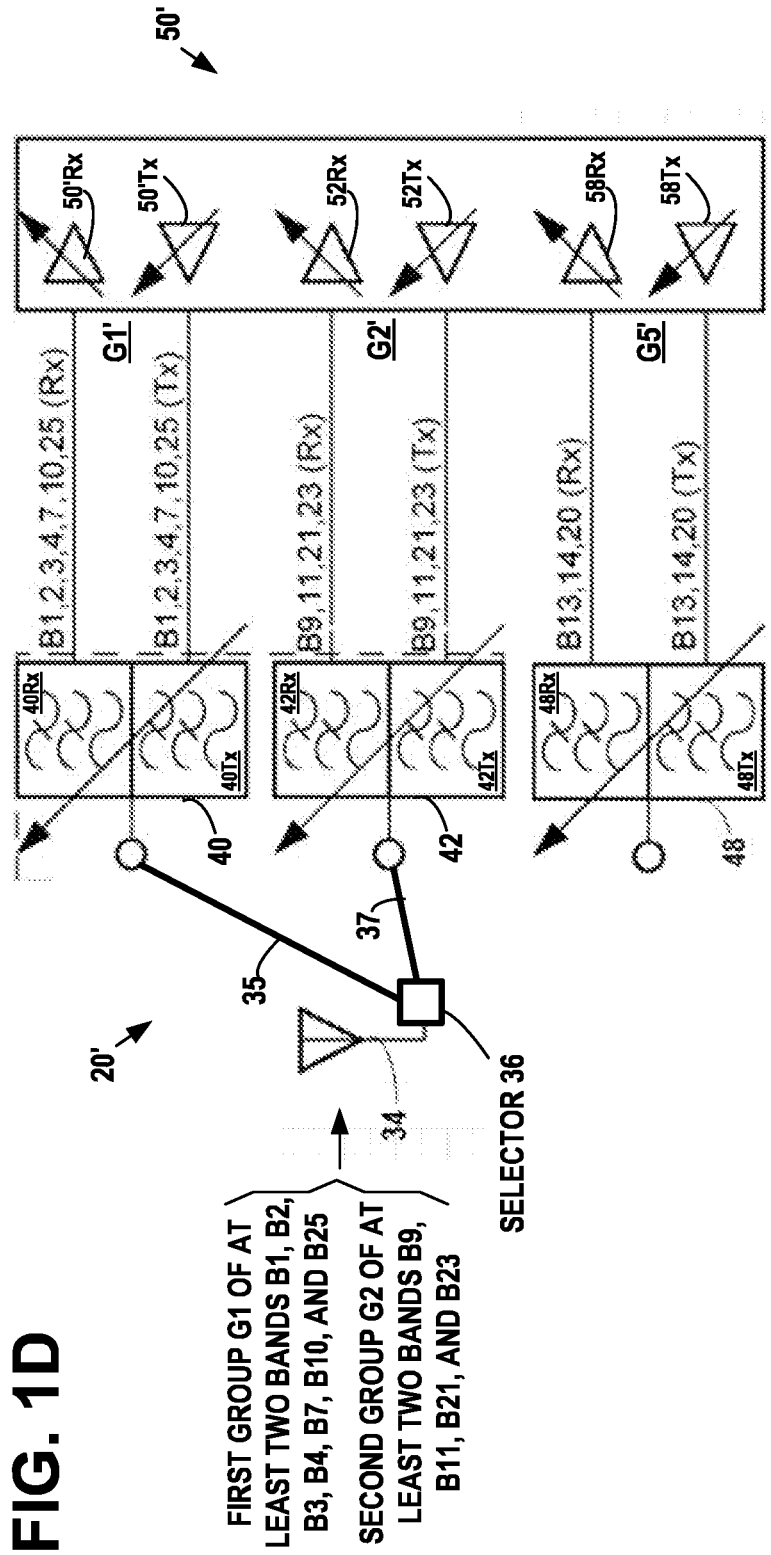
FIG. 1D is an illustration of an example embodiment of the invention, depicting a tunable RF front-end with three tunable duplexers of FIG. 3C, with the first and a second ones of the duplexers selectively connected to the single antenna, based on there being both the first group and a second group of UMTS FDD bands currently available, in accordance with an example embodiment of the invention.

FIG. 1D is an illustration of an example embodiment of the invention, depicting a tunable RF front-end with three tunable duplexers of FIG. 3C, with the first duplexer 40 and the second duplexer 42 may be selectively connected to the single antenna 34 by the selector 36, based on there being both the first group G1 of UMTS FDD bands B1, B2, B3, B4, B7, B10, and B25 and the second group G2 of UMTS FDD bands B9, B11, B21, and B23 currently available, in accordance with an example embodiment of the invention.

In accordance with an example embodiment of the invention, a communications device, such as a mobile phone, may determine that the first group G1 of UMTS FDD bands and the second group G2 of UMTS FDD bands are available for wireless communication in a current geographical region. The first group G1 of UMTS FDD bands B1, B2, B3, B4, B7, B10, and B25 may be determined to be capable of being passed by the first tunable duplexer 40. The second group G2 of UMTS FDD bands B9, B11, B21, and B23 may be determined to be capable of being passed by the second tunable duplexer 42. In accordance with an example embodiment of the invention, the tunable duplexers 40 and 42 may be selectively connected by the selector 36 to the antenna 34 to cover the UMTS FDD bands in groups G1 and G2, which may be locally available in a current geographical location.

Figure 1E:
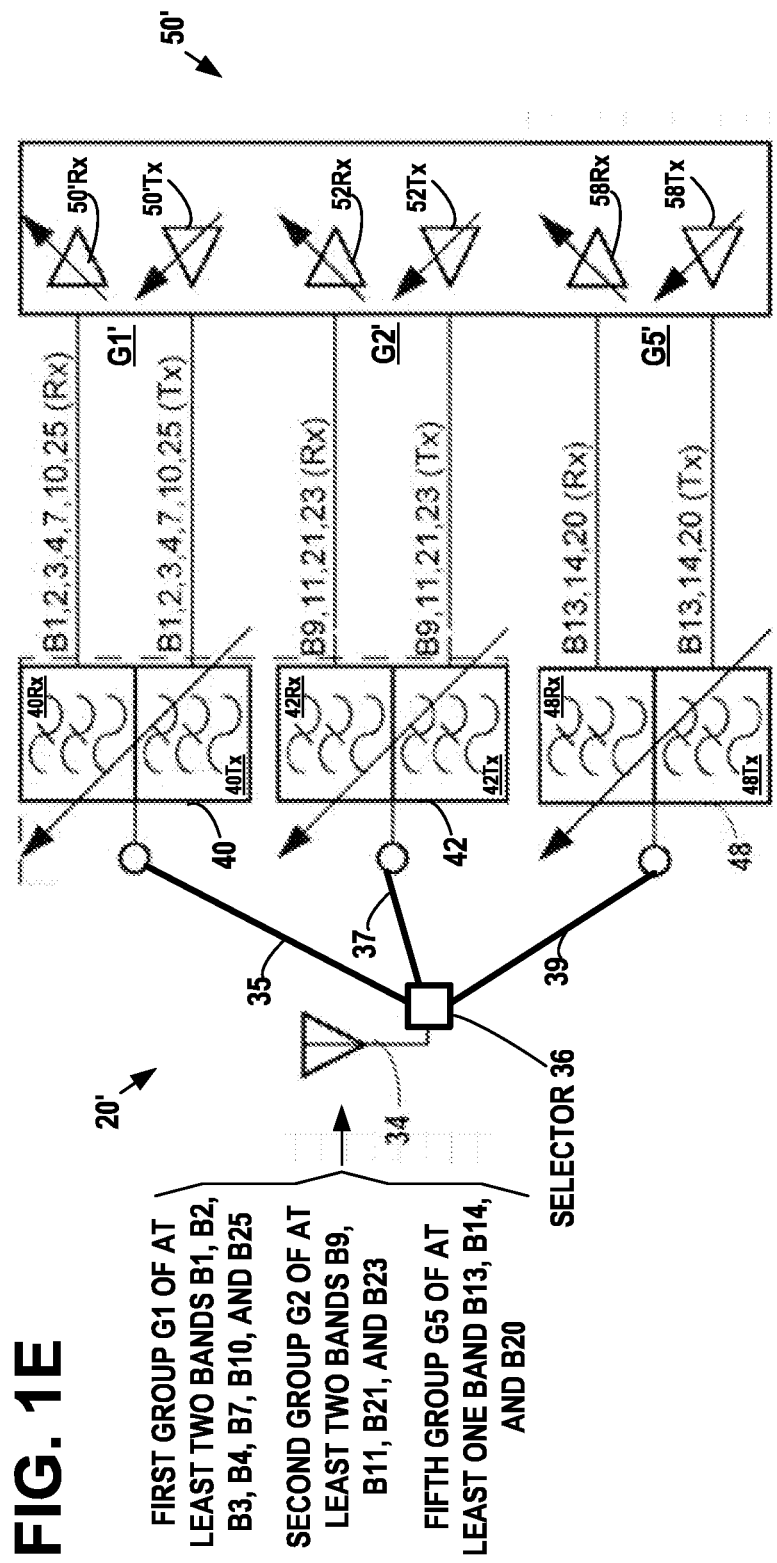
FIG. 1E is an illustration of an example embodiment of the invention, depicting a tunable RF front-end with three tunable duplexers of FIG. 3C, with the first, the second and the third ones of the duplexers selectively connected to the single antenna, based on there being both the first group, the second group and the third group of UMTS FDD bands currently available, in accordance with an example embodiment of the invention.

FIG. 1E is an illustration of an example embodiment of the invention, depicting a tunable RF front-end with three tunable duplexers of FIG. 3C, with the first duplexer 40, the second duplexer 42, and the third duplexer 48 selectively connected by the selector 36 to the single antenna 34, based on there being both the first group G1, the second group G2, and the fifth group G5 of UMTS FDD bands currently available, in accordance with an example embodiment of the invention.

In accordance with an example embodiment of the invention, a communications device, such as a mobile phone, may determine that the first group G1 of UMTS FDD bands, the second group G2 of UMTS FDD bands, and the fifth group G5 of UMTS FDD bands, are available for wireless communication in a current geographical region. The first group G1 of UMTS FDD bands B1, B2, B3, B4, B7, B10, and B25 may be determined to be capable of being passed by the first tunable duplexer 40. The second group G2 of UMTS FDD bands B9, B11, B21, and B23 may be determined to be capable of being passed by the second tunable duplexer 42. The fifth group G5 of UMTS FDD bands B13, B14, and B20 may be determined to be capable of being passed by the third tunable duplexer 48. In accordance with an example embodiment of the invention, the tunable duplexers 40, 42, and 48 may be selectively connected by the selector 36 to the antenna 34 to cover the UMTS FDD bands in groups G1, G2, and G5 which may be locally available in a current geographical location.

Figure 2:
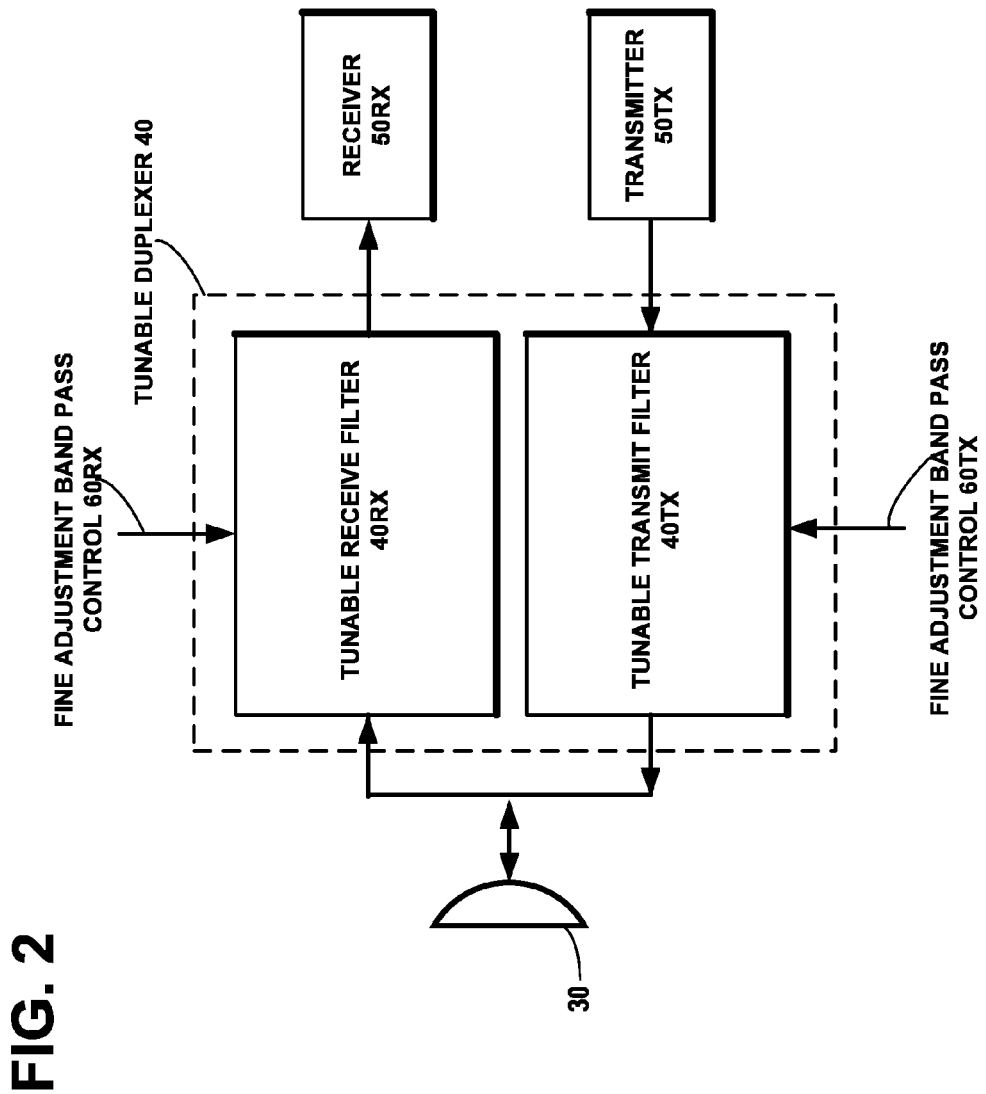
FIG. 2 is an illustration of an example embodiment of the invention, depicting a tunable duplexer circuit, in accordance with an example embodiment of the invention.

FIG. 2 is an illustration of an example embodiment of the invention, depicting a tunable duplexer circuit 40, in accordance with an example embodiment of the invention. The first duplexer 40 is shown comprising the tunable receive filter 40Rx and the tunable transmit filter 40Tx. In accordance with an example embodiment of the invention, the tunable receive filter 40Rx and the tunable transmit filter 40TX have been tuned to enable a particular band of the first Group G1, to pass signals of the desired band. For example, the tunable transmit filter 40Tx may be tuned so that the $L_{01}$ inductance value enables passing Tx signals in the B1 band grouped in the first group G1. $L_{01}$ is referred to as the L1 inductance value. The tunable receive filter 40Rx passes the Rx signals in the B1 band, from the antenna 30 to the broadband receiver I/O port 50Rx of the a transceiver 50. The tunable transmit filter 40Tx passes the Tx signals in the B1 band from the broadband transmitter I/O port 50Tx of the a transceiver 50, to the antenna 30.

In accordance with an example embodiment of the invention, regarding the tunable receive filter topology, it has the identical design procedure as is used for the tunable transmit filter topology. This may be understood by the fact that only the center frequency and, thus, the matching inductance, is changed. For brevity, the design procedure and the resulting illustrations for the transmit filters may also be used to represent the receive filters. The band combinations for the tunable receive filters are identical to those for the tunable transmit filters.

For a finished communications device, such as a mobile phone, which has been designed and manufactured in accordance with an example embodiment of the invention, fine adjustments may be made to the band pass characteristics of the tunable receive filter 40Rx and the tunable transmit filter 40TX for certain bands that are locally available within the group G1. The fine adjustment fine adjustment band pass control signals 60RX and 60TX shown in FIG. 2, may be applied to adjust capacitances in the respective the tunable receive filter 40RX and the tunable transmit filter 40Rx to make fine adjustments to their band pass characteristics.

In accordance with an example embodiment of the invention, the methodology for grouping the bands for a tunable transmit filter (or a tunable receive filter) is as follows, a) Bands connected to high-band antenna are in one Group A, and bands connected to low-band antenna are grouped in Group B, a. Within Group A, i. Bands with positive duplex offset and lower transmit/receive filter matching inductance values (i.e., within tunability range) are assigned to single tunable Duplexer 1.

ii. Bands with positive duplex offset and higher transmit/receive filter matching inductance values are assigned to single tunable Duplexer 2.

b. Within Group B, i. Bands with positive duplex offset and lower transmit/receive filter matching inductance are assigned to single tunable Duplexer 3.

ii. Bands with positive duplex offset and higher transmit/receive matching inductance values are assigned to single tunable Duplexer 4.

iii. Bands with negative duplex offset are assigned to single tunable Duplexer 5.

In accordance with an example embodiment of the invention, if a single antenna is used, the bands can be partitioned into 3 tunable duplexers by:

(a) Bands with positive duplex offset and lower transmit/receive filter matching inductance values.

(b) Bands with positive duplex offset and higher transmit/receive filter matching inductance values.

(c) Band with negative duplex offset.

In accordance with an example embodiment of the invention, the transmit filter center frequencies greater than 1400 MHz are grouped as high-band while transmit center frequencies less than 900 MHz are grouped as low-band. Duplexers with a negative duplex frequency offset (e.g., $f_{RX}-f_{TX}<0$) are grouped in its own duplexer class. The number of low-band and high-band tunable duplexers may be determined by matching inductance used in each transmit filter, as described above.

In accordance with an example embodiment of the invention, the tunable receive filter methodology is the identical design procedure used for the tunable transmit filter methodology. This may be understood by the fact that only the center frequency and, thus, the matching inductance is changed. The band combinations for the tunable receive filters are identical to those for the tunable transmit filter.

Inductance values, unlike capacitance values, may be difficult to tune. Therefore, in accordance with an example embodiment of the invention, the bands that share similar inductance values are grouped together into duplexer classes. Table 1 lists the high-band UMTS bands with matching inductance values used in transmit filters.

TABLE 1

High-band duplexer grouping by transmit filter matching inductance (in nH)

| Band | 1 | 2 | 3 | 4 | 7 | 9 | 10 | 11 | 21 | 23 | 25 |
|---|---|---|---|---|---|---|---|---|---|---|---|
| Inductance | 3.25 | 3.25 | 2.90 | 3.75 | 3.01 | 4.24 | 3.25 | 5.63 | 6.50 | 5.63 | 3.11 |
| Duplexer | 1 | 1 | 1 | 1 | 1 | 2 | 1 | 2 | 2 | 2 | 1 |

Low-band UMTS bands with matching inductance values are listed in Table 2.

TABLE 2

Low-band duplexer grouping by transmit filter matching inductance (in nH)

| Band | 5 | 6 | 8 | 12 | 17 | 18 | 19 | 26H | 27 | 28 |
|---|---|---|---|---|---|---|---|---|---|---|
| Inductance | 5.00 | 7.96 | 4.25 | 5.90 | 7.26 | 6.50 | 7.00 | 4.59 | 6.10 | 3.75 |
| Duplexer | 4 | 3 | 4 | 3 | 3 | 3 | 3 | 4 | 3 | 4 |

UMTS bands with negative valued duplex offsets are listed in Table 3.

TABLE 3

Duplexer grouping by negative duplex frequency offset

| Band | 13 | 14 | 20 |
|---|---|---|---|
| Duplexer | 5 | 5 | 5 |

In accordance with an example embodiment of the invention, the LTE bands may be grouped into a combination of 5 tunable duplexers. The partitioning of the bands into low-band and high-band duplexers is based on using separate low-band and high-band antennae. In addition, quarter-wave resonator transmission lines may be used in either transmit or receive filters, which prevents UMTS bands with similar matching inductance values from being grouped across low-band and high-band boundaries.

In accordance with an example embodiment of the invention, the transfer functions describing the filter response(s) may be used in describing the tunable transmit filter 40Tx. These transfer functions are derived from the generalized coupling matrix theory described in the publication by R. J. Cameron, referenced above. The matching components (e.g., C01, L01) interface the matching impedance (i.e., 50 Ohms) to the filter transfer function and therefore, can be readily described using, a) Fractional bandwidth (FBW),
b) External quality factor (Qext),
c) Frequency of the first resonator (f1), and, are therefore independent of the type of components and the manner in which they are configured.

Figure 3:
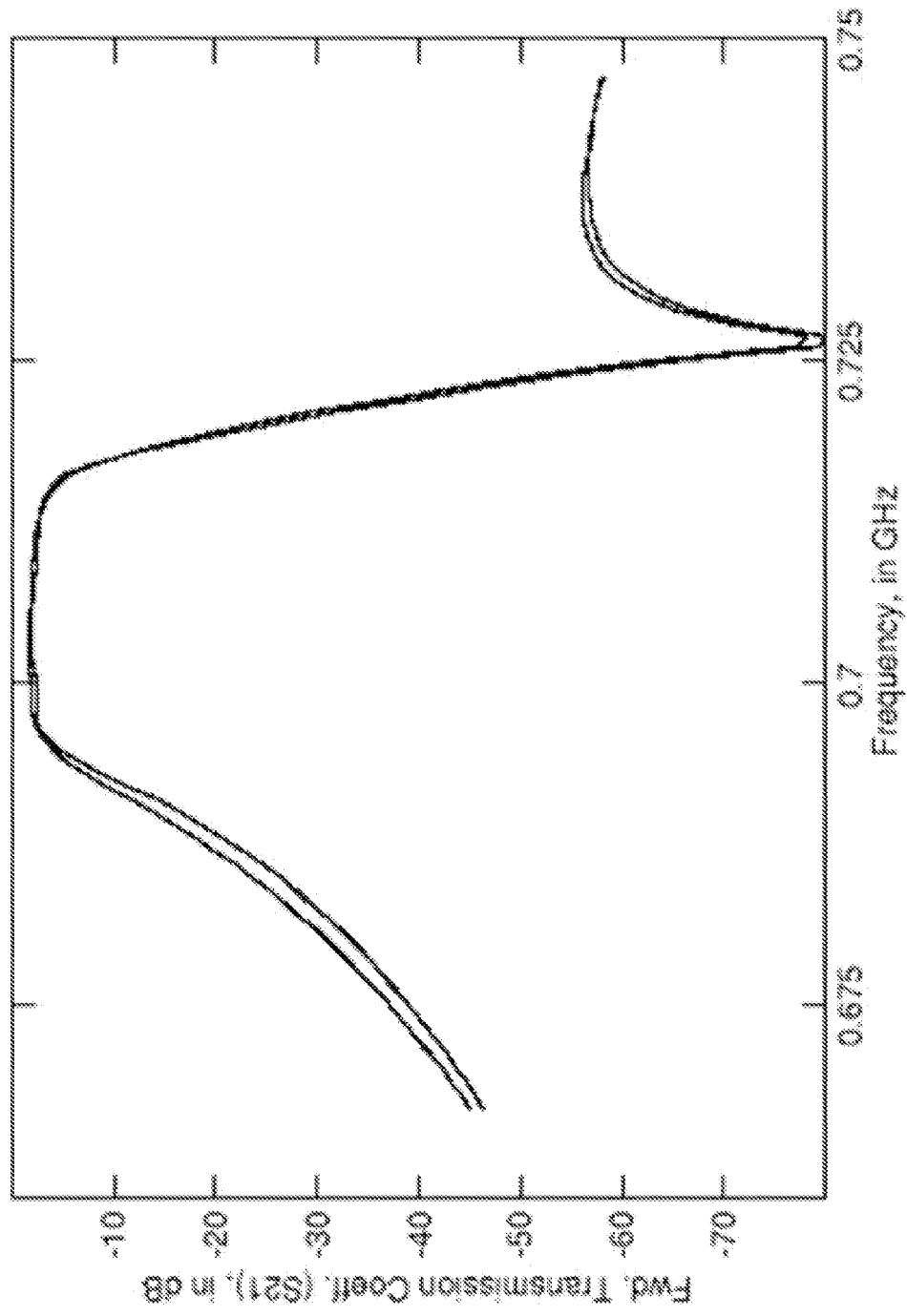
FIG. 3 is an illustration of an example embodiment of the invention, depicting forward transmission of Band 12 transmit filter with Band 12 and Band 6 matching inductance values, in accordance with an example embodiment of the invention.

FIG. 3 is an illustration of an example embodiment of the invention, depicting forward transmission of Band 12 transmit filter with Band 12 and Band 6 matching inductance values, in accordance with an example embodiment of the invention. The figure illustrates forward transmission of Band 12, operating with its own matching inductance, relative to the Band 12 performance using a Band 6 matching inductance value. Band 12 and Band 6 are chosen because they have the lowest and higher matching inductance values needed for duplexer 3 (see Table 2), respectively.

In accordance with an example embodiment of the invention, an example of the coupling matrix for a 5-pole transmit filter for Band 12 is shown in the following Table 4:

TABLE 4

Coupling Matrix For A 5-Pole Transmit Filter For Band 12

| mXY | 1 | 2 | 3 | 4 | 5 |
|---|---|---|---|---|---|
| 1 | 0.0483 | 0.9302 | 0.3029 | 0 | 0 |
| 2 | 0.9302 | −0.3526 | 0.6360 | 0 | 0 |
| 3 | 0.3029 | 0.6360 | 0.1524 | 0.6360 | 0.3029 |
| 4 | 0 | 0 | 0.6360 | 0.3526 | 0.9302 |
| 5 | 0 | 0 | 0.3029 | 0.9302 | 0.0483 |

Figure 4:
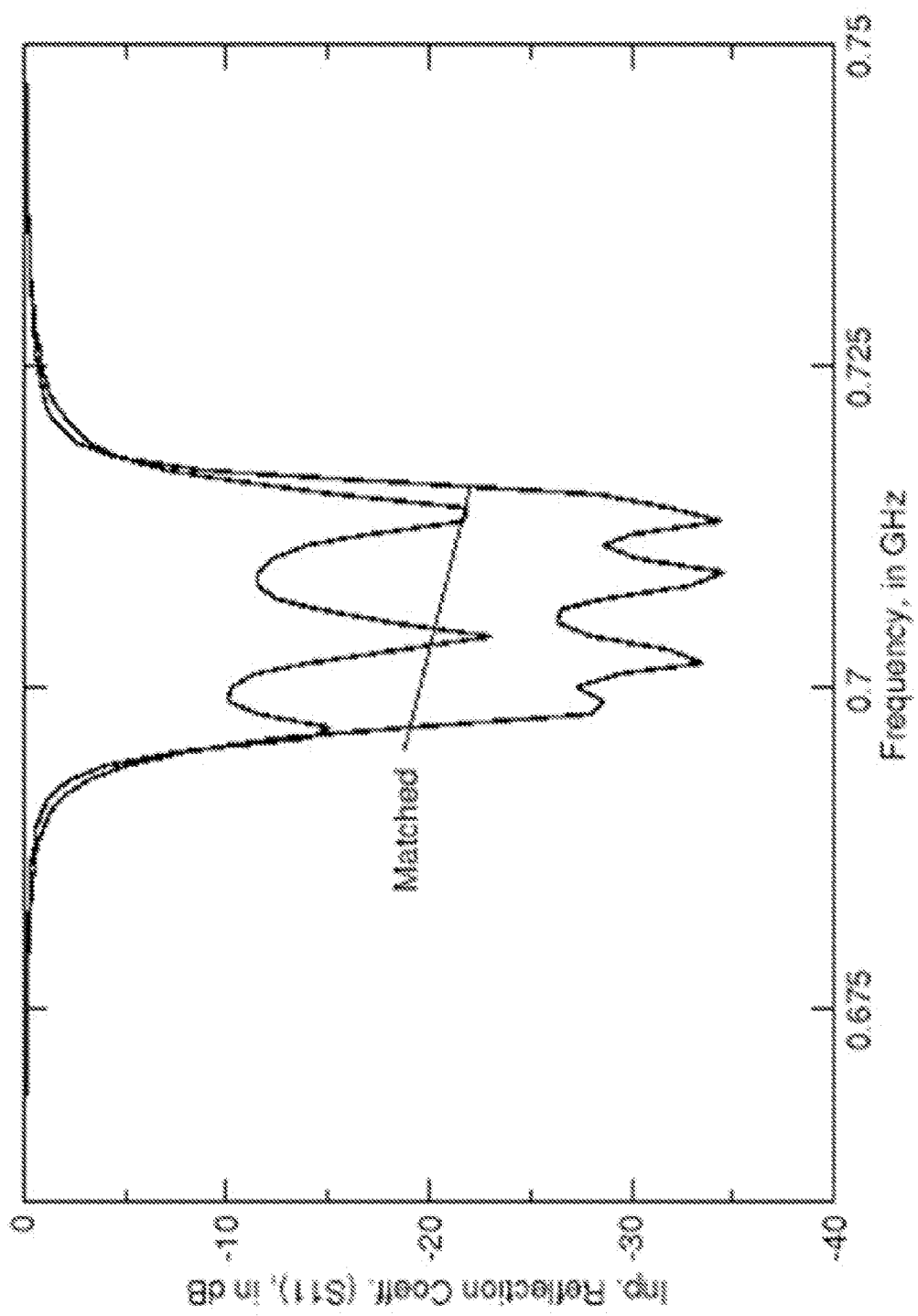
FIG. 4 is an illustration of an example embodiment of the invention, depicting input reflection coefficient of Band 12 transmit filter with Band 12 and Band 6 matching inductance values, in accordance with an example embodiment of the invention.

For Band 12, m01 = 1.1221,

FIG. 4 is an illustration of an example embodiment of the invention, depicting input reflection coefficient of Band 12 transmit filter with Band 12 and Band 6 matching inductance values, in accordance with an example embodiment of the invention. The figure illustrates a larger but, still adequate ($S_{11}$<−10 dB), difference in the input matching performance.

Figure 5:
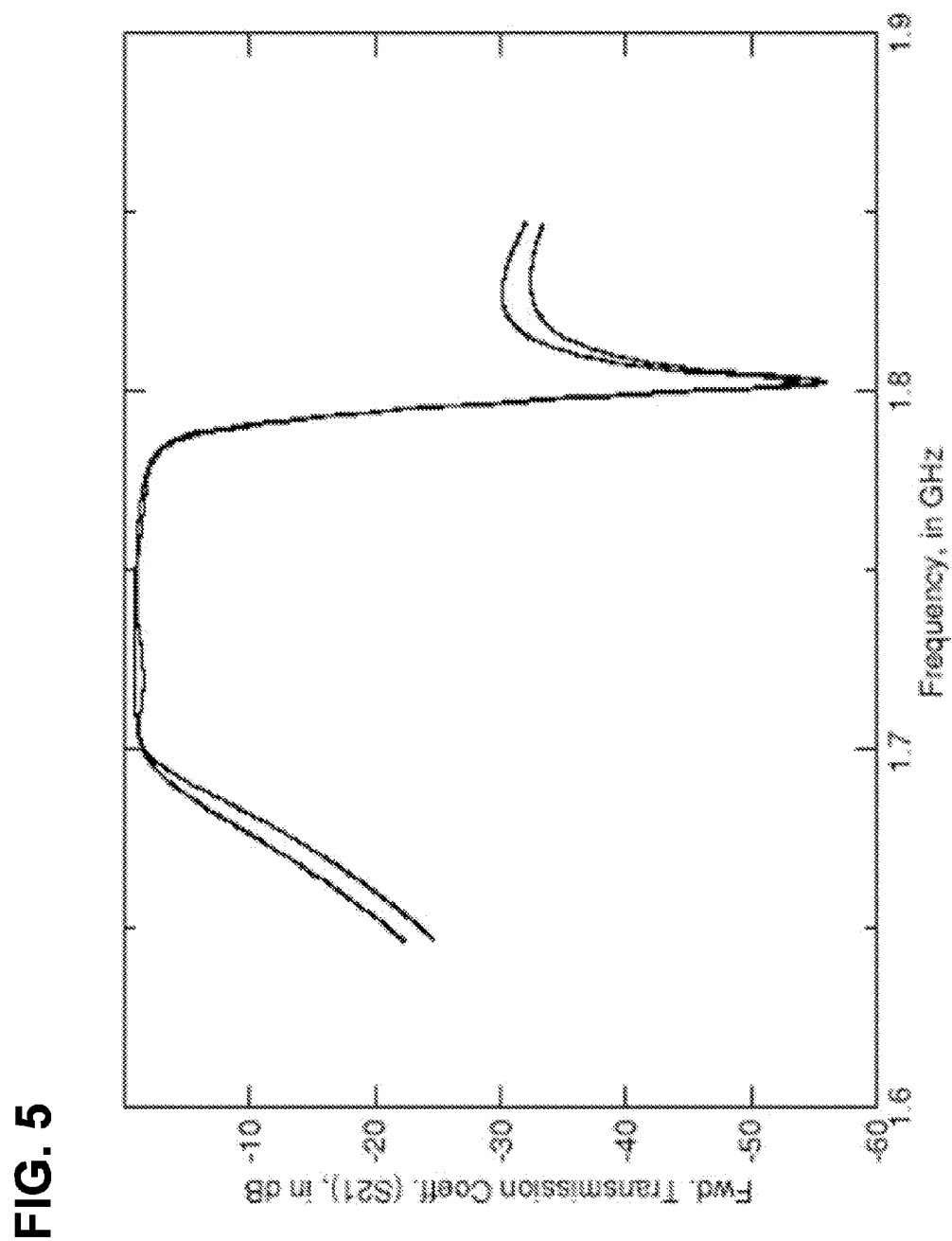
FIG. 5 is an illustration of an example embodiment of the invention, depicting forward transmission of Band 3 transmit filter with Band 3 and Band 4 matching inductance values, in accordance with an example embodiment of the invention.

FIG. 5 is an illustration of an example embodiment of the invention, depicting forward transmission of Band 3 transmit filter with Band 3 and Band 4 matching inductance values, in accordance with an example embodiment of the invention. The figure illustrates the forward transmission of Band 3 with its matched inductance, in addition to its forward transmission with a Band 4 matched inductance. These results, in tandem with the input reflection results when using the same matched inductance values shown in FIG. 6, reveal that acceptable performance can be achieved for a high-band filter (i.e., duplexer 1, see Table 1) with a single matched inductance value. As a result, the classification method illustrates that all UMTS bands associated with FDD LTE operation may be grouped by center frequency and a single matched inductance value per duplexer.

In accordance with an example embodiment of the invention, an example of the coupling matrix for a 5-pole transmit filter for Band 3 is shown in the following Table 5:

TABLE 5

Coupling Matrix For A 5-Pole Transmit Filter For Band 3

| mXY | 1 | 2 | 3 | 4 | 5 |
|---|---|---|---|---|---|
| 1 | 0.0828 | 0.8346 | 0.5275 | 0 | 0 |
| 2 | 0.8346 | −0.6036 | 0.5379 | 0 | 0 |
| 3 | 0.5275 | 0.5379 | 0.245 | 0.5379 | 0.5275 |
| 4 | 0 | 0 | 0.5379 | 0.6036 | 0.8346 |
| 5 | 0 | 0 | 0.5275 | 0.8346 | 0.0828 |

Figure 6:
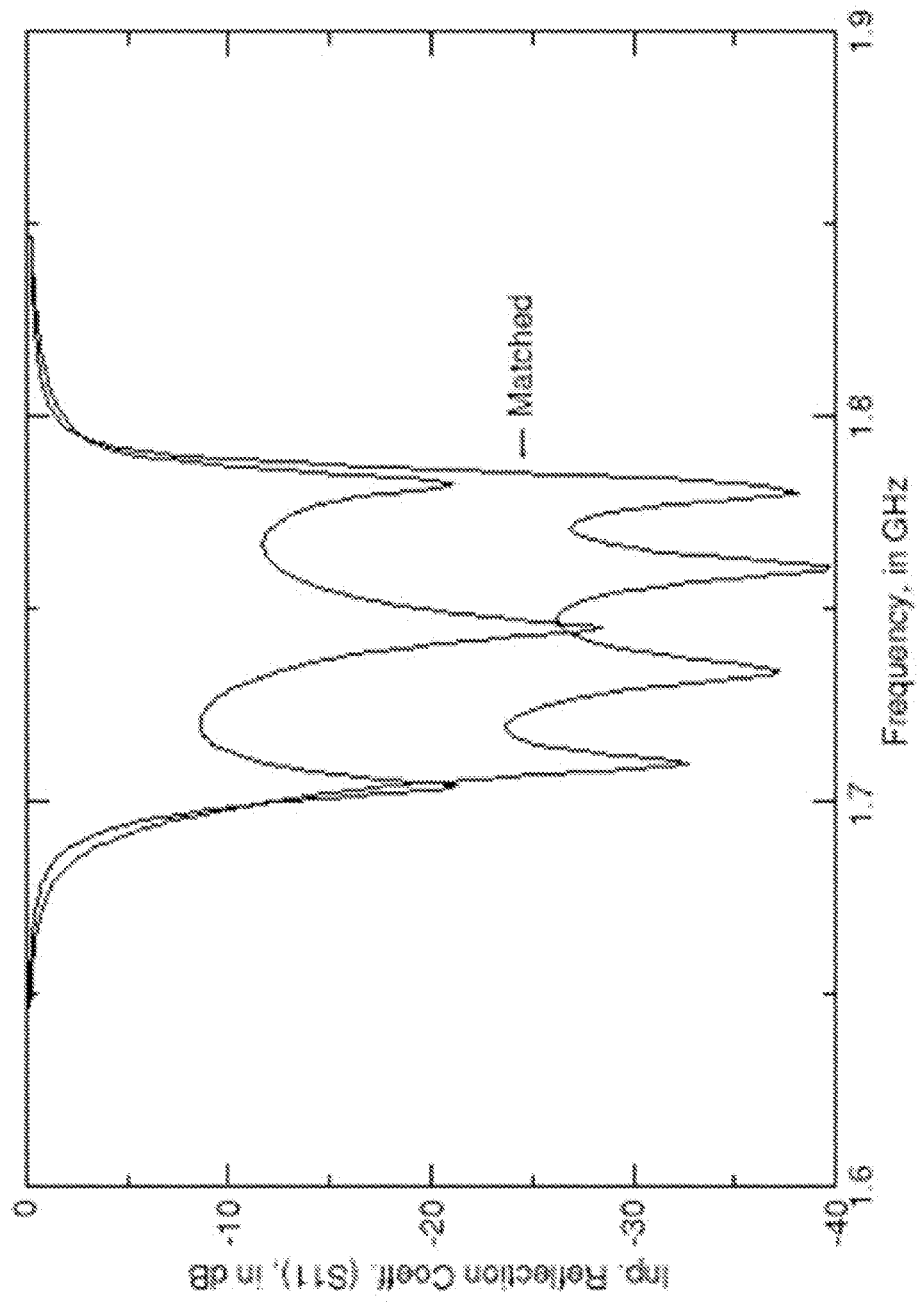
FIG. 6 is an illustration of an example embodiment of the invention, depicting input reflection coefficient of Band 3 transmit filter with Band 3 and Band 4 matching inductance values, in accordance with an example embodiment of the invention.

For Band 3, m01 = 1.1247,

FIG. 6 is an illustration of an example embodiment of the invention, depicting input reflection coefficient of Band 3 transmit filter with Band 3 and Band 4 matching inductance values, in accordance with an example embodiment of the invention.

In accordance with an example embodiment of the invention, the actual hardware transmit filter may be able to serve as an acceptable bandpass filter for both signals in Band 3 passing through at one time and for signals in Band 4 passing through at another time. The hardware components in the transmit filter are tunable and can be tuned to pass signals in Band 3. When the hardware components in the filter are tuned to pass the Band 3, the filter can be characterized by the Band 3 coupling matrix. The determination as to whether Band 4 may be grouped with Band 3 is whether the same hardware components in the transmit filter can be tuned at another time (for a different communications session) to also pass signals in Band 4.

In accordance with an example embodiment of the invention, a summary of example steps to make that determination is as follows:

Band 3 has a specific coupling matrix (e.g., MB3).

To re-tune for Band 4, a new matrix is synthesized (e.g., MB4).

Using both MB3 and MB4, the matching inductors (e.g., L_MB3 and L_MB4, respectively) are determined from the equations described in the publication by R. J. Cameron, referenced above.

Band 3 has the lowest value for transmit filter 1. Band 4 has the highest value for transmit filter 1. Thus, the litmus test is whether Band 3 can operate adequately with a Band 4 inductor (L_MB4).

Band 3, coupling matrix, with Band 4 matching components, are simulated and depicted in the figure. The resulting performance is the litmus test and argument for grouping of bands that utilize the same matching (i.e., static) components are used.

In accordance with an example embodiment of the invention, the following Table 6 is an example sequence of steps to determine whether Band 4 may be grouped with the Band 3 transmit filter and the resulting matching parameters for Band 3 and Band 4.

TABLE 6

Example Sequence Of Steps for Grouping Band 4 With Band 3

System impedance (Z0): 50 Ohms
Input Reflection Coeff. (S11): −25 dB
Center Frequency (F0): 1750 MHz
Bandwidth (BW): 75 MHz
Fractional bandwidth (FBW): BW/F0
m01 (coupling matrix entry): +1.1247
m11 (coupling matrix entry): +0.0828
External quality factor (Qe): 1/(m01 × m01 × FBW)
Frequency of first resonator (F1): F0 × (sqrt(1 + (m11 × FBW/2) × (m11 × FBW/2)) − (m11 × FBW/2))
Angular frequency of first resonator (W1): 2 × p × F1
Inductance of first resonator (L0): parameter is user defined (e.g., 0.1 nH)
Capacitance of first resonator (C1): 1/(W1 × W1 × L0)
Matching capacitance (C01): sqrt(C1/(Z0 × Qe × W1))
Matching inductance (L01): 1/(W1 × W1 × C01)
C1 (B3,B4): (83.005 pF, 84.439 pF)
L01 (B3,B4): (2.8988 nH, 3.7520 nH)
C01 (B3,B4): (2.8635 pF, 2.2505 pF)
Moving from Band 3 to Band 4 would require a change to both C1, L01, C01.
Capacitance(s) C01, C1 can be varied. The question is: what is the B4 response with L01 from B3.
Iterate backwards to determine m01, m11 (and m55).

TABLE 6-continued

Example Sequence Of Steps for Grouping Band 4 With Band 3

Re-simulate and compare,
    Forward transmission (S21, Transducer gain).
    Input reflection coefficient (S11).
Because the matching for B4 (with B3 L01) is mismatched, the S11 will not be −25 dB. What is important to judge is,
    the location of the poles in the S11 response (are they symmetric about the center frequency)? Yes.
    the magnitude of the S11 less than −5 dB (worst case)? Yes.

Classifying the UMTS bands by matching inductance assures that the bands have approximately the same matching conditions.

Figure 7:
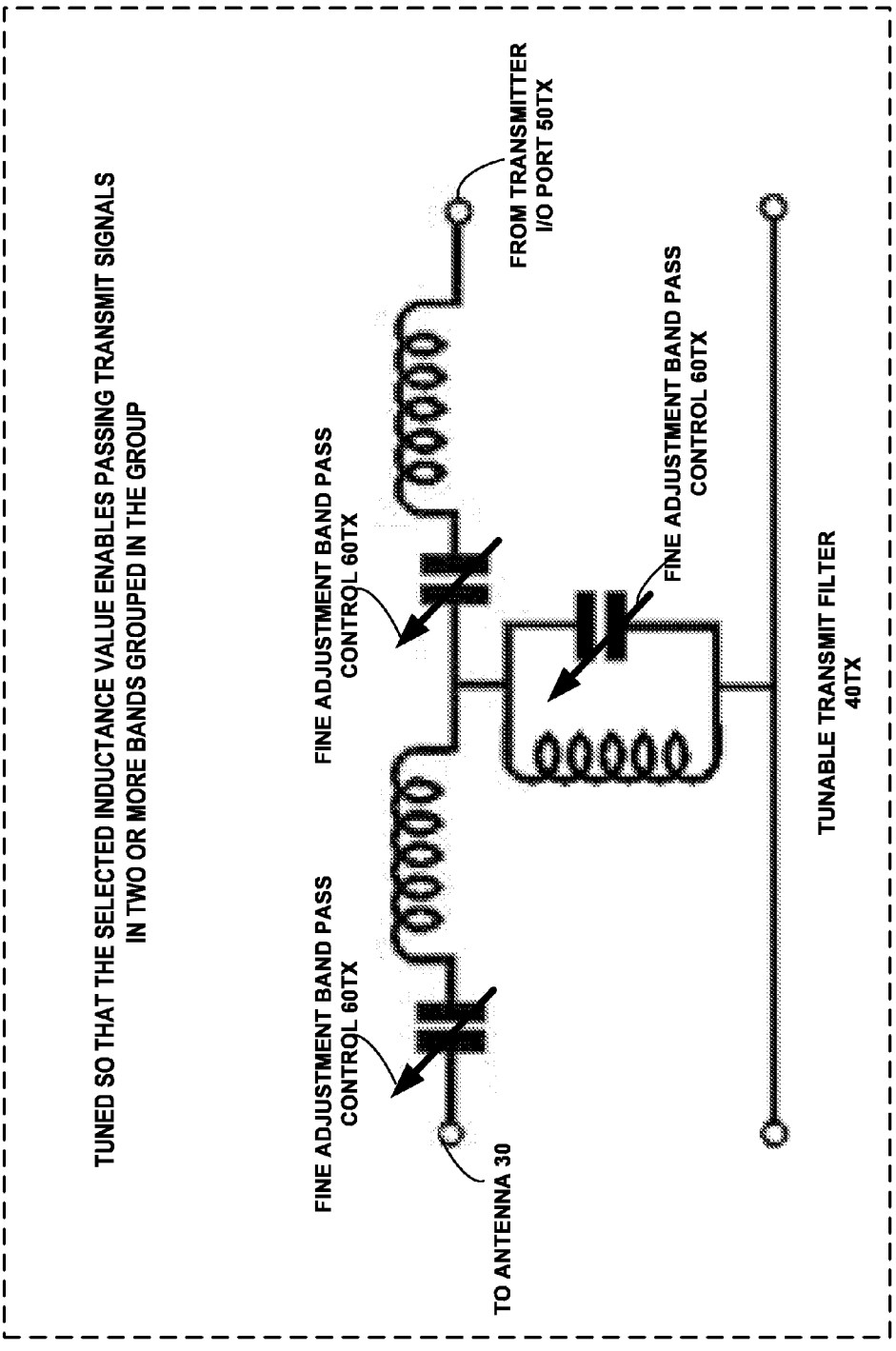
FIG. 7 is an illustration of an example embodiment of the invention, depicting an example tunable transmit filter circuit. The non-limiting example shown is a T-section bandpass filter tuned so that the selected inductance value enables passing transmit signals in two or more bands grouped in the group, in accordance with an example embodiment of the invention.

FIG. 7 is an illustration of an example embodiment of the invention, depicting an example tunable transmit filter circuit 40Tx. A skilled person in this art would recognize that there are many ways to implement a tunable filter. This is one non-limiting example of a tunable filter. The example shown is a T-section bandpass filter tuned so that the selected inductance value enables passing transmit signals in two or more bands grouped in the group. The figure shows an example transmit filter circuit that has been tuned to the selected inductance value, in accordance with the invention. The tunable transmit filter 40Tx has been tuned to enable a particular band of the first Group G1, to pass signals of the desired band. For example, the tunable transmit filter 40Tx may be tuned so that the $L_{01}$ inductance value enables passing Tx signals in the B1 band grouped in the first group G1. $L_{01}$ is referred to as the L1 inductance value. The tunable transmit filter 40Tx passes the Tx signals in the B1 band from the broadband transmitter I/O port 50Tx of the a transceiver 50, to the antenna 30. The tunable transmit filter circuit 40TX in the duplexer 40, may be capable of being tuned to have an inductance value approximately matching at least two inductance values corresponding respectively to pass Tx signals in at least two of the bands B1, B2, B3, B4, B7, B10, and B25 in the group G1, from the transmitter I/O port 50Tx to the antenna 30. Classifying the UMTS bands by matching inductance assures that the bands have approximately the same matching conditions.

In accordance with an example embodiment of the invention, a completed mobile phone in the hands of a user, may have been designed and manufactured with at least one of five tunable duplexers 40, 42, 44, 46, and 48. For example, the tunable transmit filter 40TX of FIG. 7, in at least one of the duplexers 40, may have been designed and manufactured to have an inductance value of L01 to pass Tx signals in at least two of the bands B1, B2, B3, B4, B7, B10, and B25 in the group G1, as previously discussed. In order to make fine adjustments to the band pass characteristics of the tunable transmit filter 40TX for certain bands that are locally available in the group G1, a fine adjustment band pass control signal 60TX may be applied to adjust the capacitance of one or more capacitors in the tunable transmit filter 40TX, as shown in the example band pass circuit of FIG. 7. The fine adjustment band pass control signal 60TX may be based on Mobile Industry Processor Interface (MIPI) technology, signaling characteristics, and protocols. In this manner, the band pass characteristics of the tunable transmit filter 40TX may be tweaked by the fine adjustment band pass control signal 60TX in the user's phone, around a nominal band pass characteristic, based on the local availability of certain bands within the band group handled by that filter.

Figure 8:
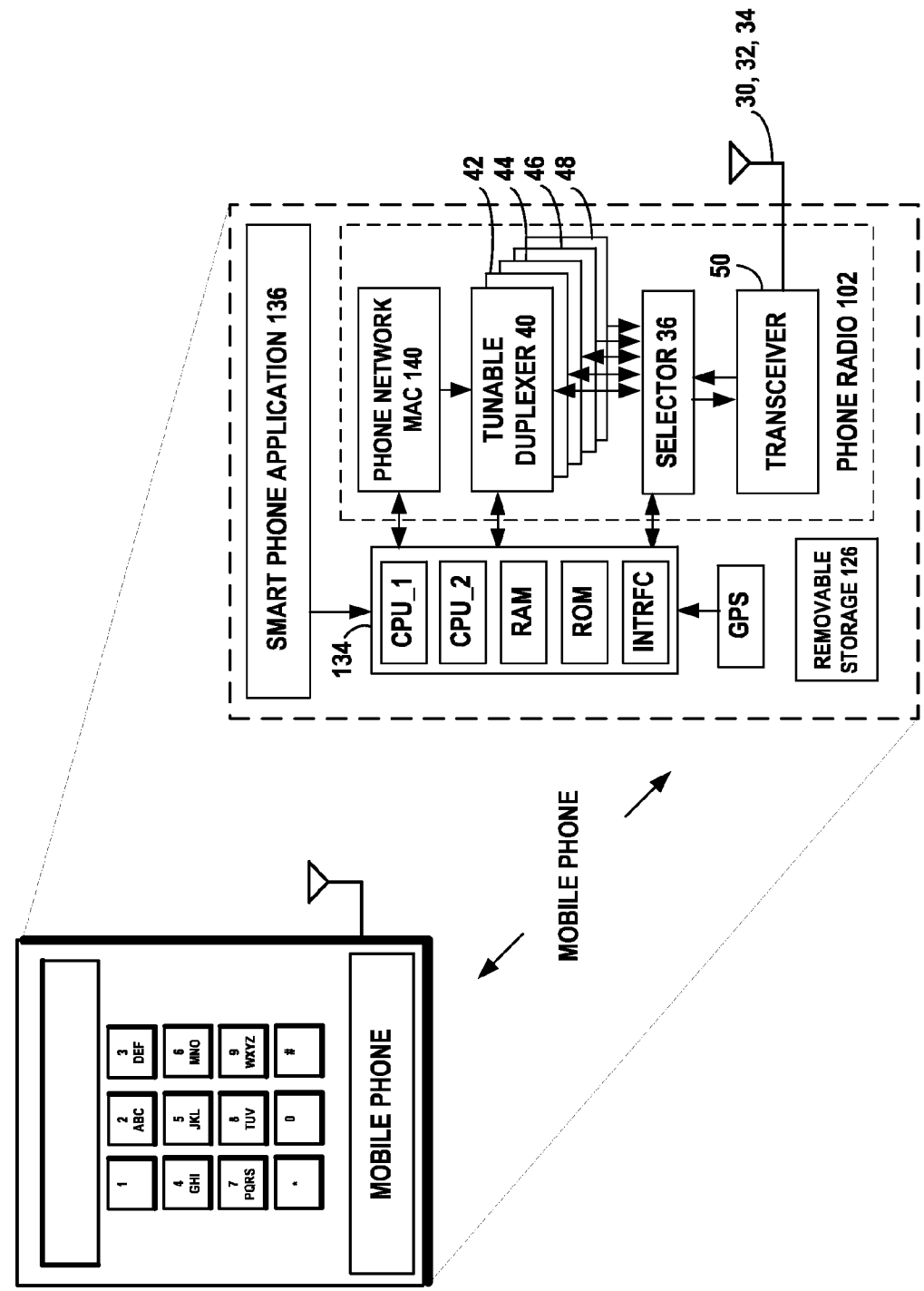
FIG. 8 is an example functional block diagram, illustrating an example mobile telephone, according to an example embodiment of the invention.

FIG. 8 is an example functional block diagram, illustrating an example mobile telephone, according to an example embodiment of the invention. The example mobile telephone may include a processor 134 that may include a dual or multi-core central processing unit CPU_1 and CPU_2, a RAM memory, a ROM memory, and an interface for a keypad, display, and other input/output devices. The example mobile telephone may include a protocol stack, including the phone network MAC 140, the tunable duplexers 40, 42, 44, 46, and 48, and a smart phone application program 136. The example mobile telephone may include one or more antennas, such as antenna 30 of FIGS. 1A and 1B, antenna 32 of FIGS. 1A and 1B, and/or antenna 34 of FIG. 1C. The selector 36 may be controlled by the processor 134, to selectively connect the tunable duplexers 40, 42, 44, 46, and 48 to the transceiver 50 and the antennas 30, 32, and/or 34.

In accordance with an example embodiment of the invention, a location determination module, such as the GPS module, is configured to determine a current geographical region for the mobile telephone, in which regional radio frequency communication bands are known to be available for the current geographical region. The processor 134 may be coupled to the GPS location determination module and to the tunable duplexers 40, 42, 44, 46, and 48. The processor 134 may be configured to provide fine adjustment band pass control signals 60Tx, etc. and 60Rx, etc. to finely adjust the band pass characteristics of the tunable transmit filter 40Tx, 42Tx, 44Tx, 46Tx, and 48Tx and the tunable receive filters 40Rx, 42Rx, 44Rx, 46Rx, and 48Rx in the respective tunable duplexers 40, 42, 44, 46, and 48, based on the regional radio frequency communication bands known to be available in the determined current geographical region. The processor 134 may control the selector 36 to selectively connect the duplexers 40 and 42 to the high band antenna 30 and the duplexers 44, 46, and 48 to the low band antenna 32 as shown in FIGS. 1A and 1B. Alternately, the processor 134 may control the selector 36 to selectively connect the duplexers 40, 42, and 48 to the same antenna 34 as shown in FIG. 1C. The location determination module in the mobile telephone, may be at least one of a user interface or a global position system (GPS) receiver, configured to receive data identifying a current geographical region for the mobile telephone. The memory RAM or ROM in the processor 134 or the removable storage 126 may store the known available regional radio frequency communication bands. Alternately, the processor 134 may be configured to download current geographical region data and the known available regional radio frequency communication bands from a remote server via the transceiver 50. In accordance with an example embodiment of the invention, the mobile phone may include the five tunable duplexers 40, 42, 44, 46, and 48 of FIG. 1A, which cover one or more UMTS FDD bands.

In accordance with an example embodiment of the invention, the processor 134 may be configured to cause fine adjustments to be made to the band pass characteristics of the tunable transmit filter 40TX of FIG. 7, in at least one of the duplexers 40. In order to make fine adjustments to the band pass characteristics of the tunable transmit filter 40TX for certain bands that are locally available in the group G1, the processor 134 may be configured adjust the fine adjustment band pass control signal 60TX applied to the capacitance of one or more capacitors in the tunable transmit filter 40TX, as shown in the example band pass circuit of FIG. 7. The processor 134 may generate fine adjustment band pass control signal 60TX based on Mobile Industry Processor Interface (MIPI) technology, signaling characteristics, and protocols. In this manner, the band pass characteristics of the tunable transmit filter 40TX may be tweaked by the fine adjustment band pass control signal 60TX generated by the processor 134, around a nominal band pass characteristic, based on the local availability of certain bands within the band group handled by that filter.

In an example embodiment, the interface circuits may interface with one or more radio transceivers, battery and other power sources, key pad, touch screen, display, microphone, speakers, ear pieces, camera or other imaging devices, etc. The RAM and ROM may be removable memory devices 126 such as smart cards, SIMs, WIMs, semiconductor memories such as RAM, ROM, PROMS, flash memory devices, etc. The processor protocol stack layers, and/or application program may be embodied as program logic stored in the RAM and/or ROM in the form of sequences of programmed instructions which, when executed in the CPU, carry out the functions of example embodiments. The program logic may be delivered to the writeable RAM, PROMS, flash memory devices, etc. from a computer program product or article of manufacture in the form of computer-usable media such as resident memory devices, smart cards or other removable memory devices. Alternately, they may be embodied as integrated circuit logic in the form of programmed logic arrays or custom designed application specific integrated circuits (ASIC). The one or more radios in the device may be separate transceiver circuits or alternately, the one or more radios may be a single RF module capable of handling one or multiple channels in a high speed, time and frequency multiplexed manner in response to the processor. An example of removable storage media 126 may be based on magnetic, electronic and/or optical technologies. Examples of removable storage media 126 include magnetic disks, optical disks, semiconductor memory circuit devices and micro-SD memory cards (SD refers to the Secure Digital standard). The removable storage media 126 may store data and/or computer program code as an example computer program product, in accordance with at least one embodiment of the present invention.

FIG. 9 is an example flow diagram 900 of operational steps in the mobile telephone, according to an example embodiment of the invention. The steps of the flow diagram represent computer code instructions stored in the RAM and/or ROM memory of the wireless device A, which when executed by the central processing units (CPU), carry out the functions of the example embodiments of the invention. The steps may be carried out in another order than shown and individual steps may be combined or separated into component steps. Additional steps may be included in this sequence. The steps of the example method are as follows.

Step 902: determining, by an apparatus, that a first plurality of bands of radio frequency communication and a second plurality of bands of radio frequency communication are available for wireless communication in a current geographical region;

Step 904: determining, by the apparatus, that communication signals of at least two bands of the first plurality of bands, are capable of being passed by a tunable transmit filter of a first tunable duplexer, based on the tunable transmit filter being tuned to have an inductance value approximately matching at least two inductance values corresponding respectively to the at least two bands of the first plurality;

Step 906: determining, by the apparatus, that communication signals of at least two bands of the second plurality of bands, are capable of being passed by a second tunable transmit filter of a second tunable duplexer, based on the second tunable transmit filter being tuned to have an inductance value approximately matching at least two inductance values corresponding respectively to the at least two bands of the second plurality; and Step 908: connecting, by the apparatus, the at least two bands of the first plurality of bands, to the first tunable duplexer and the at least two bands of the second plurality of bands, to the second tunable duplexer.

In accordance with an example embodiment of the invention, the following Table 7 lists the frequencies corresponding to the UMTS FDD band numbers 1 through 29. The transmit (Tx) frequencies and receive frequencies (Rx) for each numbered band are listed in respective columns for the lower bound frequency (FL) of the numbered band and the upper bound frequency (FU) of the numbered band.

TABLE 7

| Band | Tx [MHz] FL | Tx [MHz] FU | Rx [MHz] FL | Rx [MHz] FU | |
|---|---|---|---|---|---|
| 1 | 1920 | 1980 | 2110 | 2170 | |
| 2 | 1850 | 1910 | 1930 | 1990 | |
| 3 | 1710 | 1785 | 1805 | 1880 | |
| 4 | 1710 | 1755 | 2110 | 2155 | |
| 5 | 824 | 849 | 869 | 894 | |
| 6 | 830 | 840 | 875 | 885 | |
| 7 | 2500 | 2570 | 2620 | 2690 | |
| 8 | 880 | 915 | 925 | 960 | |
| 9 | 1749.9 | 1784.9 | 1844.9 | 1879.9 | |
| 10 | 1710 | 1770 | 2110 | 2170 | |
| 11 | 1427.9 | 1447.9 | 1475.9 | 1495.9 | |
| 12 | 698 | 716 | 728 | 746 | |
| 13 | 777 | 787 | 746 | 756 | |
| 14 | 788 | 798 | 758 | 768 | |
| 15 | 1900 | 1920 | 2600 | 2620 | No in use. |
| 16 | 2010 | 2025 | 2585 | 2600 | No in use. |
| 17 | 704 | 716 | 734 | 746 | |
| 18 | 815 | 830 | 860 | 875 | |
| 19 | 830 | 845 | 875 | 890 | |
| 20 | 832 | 862 | 791 | 821 | |
| 21 | 1447.9 | 1462.9 | 1495.9 | 1510.9 | |
| 22 | 3410 | 3500 | 3510 | 3600 | Not in use. |
| 23 | 2000 | 2020 | 2180 | 2200 | |
| 24 | 1646.7 | 1651.7 | 1670 | 1675 | Temporary. |
| 25 | 1850 | 1915 | 1930 | 1995 | |
| 26-L | 814 | 819.9 | 859 | 864.9 | |
| 26-H | 820 | 849 | 865 | 894 | |
| 27 | 807 | 824 | 852 | 869 | |
| 28 | 703 | 748 | 758 | 803 | |
| 29 | | | 717 | 728 | Downlink only |

An example embodiment of the invention includes an apparatus comprising:

means for determining, by an apparatus, that a first plurality of bands of radio frequency communication and a second plurality of bands of radio frequency communication are available for wireless communication in a current geographical region;

means for determining, by the apparatus, that communication signals of at least two bands of the first plurality of bands, are capable of being passed by a tunable transmit filter of a first tunable duplexer, based on the tunable transmit filter being tuned to have an inductance value approximately matching at least two inductance values corresponding respectively to the at least two bands of the first plurality;

means for determining, by the apparatus, that communication signals of at least two bands of the second plurality of bands, are capable of being passed by a second tunable transmit filter of a second tunable duplexer, based on the second tunable transmit filter being tuned to have an inductance value approximately matching at least two inductance values corresponding respectively to the at least two bands of the second plurality; and means for connecting, by the apparatus, the at least two bands of the first plurality of bands, to the first tunable duplexer and the at least two bands of the second plurality of bands, to the second tunable duplexer.

An example embodiment of the invention includes an apparatus (the mobile phone of FIG. 8) comprising:
at least one processor (134);
at least one memory including computer program code (902, 904, 906, 908);
the at least one memory (RAM/ROM) and the computer program code configured to, with the at least one processor, cause the apparatus at least to:
determine (902) that a first plurality of bands of radio frequency communication (B1, B2, etc.) and a second plurality of bands of radio frequency communication (B9, B11, etc.) are available for wireless communication in a current geographical region;
determine (904) that communication signals of at least two bands of the first plurality of bands, are capable of being passed by a tunable transmit filter of a first tunable duplexer (40), based on the tunable transmit filter being tuned to have an inductance value approximately matching at least two inductance values corresponding respectively to the at least two bands of the first plurality;
determine (906) that communication signals of at least two bands of the second plurality of bands, are capable of being passed by a second tunable transmit filter of a second tunable duplexer (42), based on the second tunable transmit filter being tuned to have an inductance value approximately matching at least two inductance values corresponding respectively to the at least two bands of the second plurality; and
connect (908, selector 36, and antenna 30 or 34) the at least two bands of the first plurality of bands, to the first tunable duplexer and the at least two bands of the second plurality of bands, to the second tunable duplexer.

In an example embodiment of the invention, wireless networks may include other type networks. Examples of such networks include, for example cellular systems such as Global System for Mobile Communications (GSM), Wideband Code Division Multiple Access (W-CDMA), High Speed Packet Access (HSPA), Long Term Evolution (LTE), LTE Advanced (LTE-A), International Mobile Telecommunications Advanced (IMT-A), CDMA, Wireless Metropolitan Area Networks (WMAN) and Broadband Wireless Access (BWA) (LMDS, WiMAX, AIDAAS and HiperMAN), or the like networks. Examples of such networks include, for example, short-range networks such as Bluetooth, Zigbee, IEEE 802.11, Digital Enhanced Cordless Telecommunications (DECT), HiperLAN, Radio Frequency Identification (RFID), Wireless USB, DSRC (Dedicated Short-range Communications), Near Field Communication, wireless sensor networks, EnOcean; TransferJet, Ultra-wideband (UWB from WiMedia Alliance), WLAN, WiFi, and HiperLAN.

The example embodiment of the invention may reduce the amount of duplexers from potentially more than 20 to 5 needed to manufacture a handset that works on LTE networks world-wide.

Although specific example embodiments have been disclosed, a person skilled in the art will understand that changes can be made to the specific example embodiments without departing from the spirit and scope of the invention.

What is claimed is:

1. An apparatus, comprising: a tunable duplexer selectively connected to an antenna, configured to transmit and receive radio frequency communication signals in a group of at least two bands; a tunable transmit filter in the duplexer, capable of being tuned to have an inductance value approximately matching at least two inductance values corresponding respectively to pass the at least two bands in the group, each of the at least two bands in the group having a positive duplex offset and each of the at least two inductance values that correspond respectively to the at least two bands in the group, having an inductance value that approximately matches the inductance values corresponding respectively to the other bands in the group; and a second tunable duplexer selectively connected to the antenna, configured to transmit and receive radio frequency communication signals in a second group of at least two bands, the second duplexer comprising a tunable transmit filter capable of being tuned to have an inductance value approximately matching at least two inductance values corresponding respectively to pass the at least two bands in the second group, each of the at least two bands in the second group having a positive duplex offset and each of the at least two inductance values that correspond respectively to the at least two bands in the second group, having a higher inductance value than the inductance value in the first said group, which approximately matches the inductance values corresponding respectively to the other bands in the second group.

2. The apparatus of claim 1, further comprising: a tunable receive filter in the second duplexer, capable of being tuned to have an inductance value approximately matching at least two inductance values corresponding respectively to pass receive frequency signals of the at least two bands in the second group.

3. The apparatus of claim 1, further comprising: a third tunable duplexer selectively connected to the antenna, configured to transmit and receive radio frequency communication signals in a third group of at least two bands having a negative duplex offset.

4. The apparatus of claim 3, further comprising: a tunable transmit filter in the third duplexer, capable of being tuned to have an inductance value approximately matching at least two inductance values corresponding respectively to pass the at least two bands in the third group; and a tunable receive filter in the third duplexer, capable of being tuned to have an inductance value approximately matching at least two inductance values corresponding respectively to pass receive frequency signals of the at least two bands in the third group.

5. An apparatus, comprising: a tunable duplexer selectively connected to an antenna, configured to transmit and receive radio frequency communication signals in a group of at least two bands; a tunable transmit filter in the duplexer, capable of being tuned to have an inductance value approximately matching at least two inductance values corresponding respectively to pass the at least two bands in the group, each of the at least two bands in the group having a positive duplex offset and each of the at least two inductance values that correspond respectively to the at least two bands in the group, having an inductance value that approximately matches the inductance values corresponding respectively to the other bands in the group; and wherein the tunable duplexer is selectively connected to a high-band antenna, configured to transmit and receive high-band radio frequency communication signals in the group of at least two bands, and each of the at least two inductance values that correspond respectively to the at least two bands in the group, having a lower inductance value that approximately matches the inductance values corresponding respectively to the other bands in the group; and a second tunable duplexer selectively connected to the high-band antenna, configured to transmit and receive high-band radio frequency communication signals in a second group of at least two bands, the second duplexer comprising a tunable transmit filter capable of being tuned to have an inductance value approximately matching at least two inductance values corresponding respectively to pass the at least two bands in the second group, each of the at least two bands in the second group having a positive duplex offset and each of the at least two inductance values that correspond respectively to the at least two bands in the second group, having a higher inductance value than the lower inductance value in the first said group, which approximately matches the inductance values corresponding respectively to the other bands in the second group.

6. The apparatus of claim 5, further comprising: a third tunable duplexer selectively connected to a low-band antenna that is a lower-band antenna than the high-band antenna, configured to transmit and receive low-band radio frequency communication signals in a third group of at least two bands, the third duplexer comprising a tunable transmit filter capable of being tuned to have an inductance value approximately matching at least two inductance values corresponding respectively to pass the at least two bands in the third group, each of the at least two bands in the third group having a positive duplex offset and each of the at least two inductance values that correspond respectively to the at least two bands in the third group, having a lower inductance value that approximately matches the inductance values corresponding respectively to the other bands in the third group.

7. The apparatus of claim 6, further comprising: a fourth tunable duplexer selectively connected to the low-band antenna, configured to transmit and receive low-band radio frequency communication signals in a fourth group of at least two bands, the fourth duplexer comprising a tunable transmit filter capable of being tuned to have an inductance value approximately matching at least two inductance values corresponding respectively to pass the at least two bands in the fourth group, each of the at least two bands in the fourth group having a positive duplex offset and each of the at least two inductance values that correspond respectively to the at least two bands in the fourth group, having a higher inductance value than the lower inductance value in the third group, which approximately matches the inductance values corresponding respectively to the other bands in the fourth group.

8. The apparatus of claim 7, further comprising: a fifth tunable duplexer selectively connected to the low-band antenna, configured to transmit and receive radio frequency communication signals in a fifth group of at least one band having a negative duplex offset.

9. the apparatus of claim 1 , further comprising: a transceiver having at least one tunable broadband I/O port coupled to the tunable duplexer.

10. The apparatus of claim 1, further comprising: a switch matrix coupled to the tunable duplexer; and a broad-band tunable transceiver having single-port coupled to the switch matrix.

11. The apparatus of claim 1, further comprising: wherein the bands are at lest one of Universal Mobile Telecommunications System (UMTS) frequency division duplex (FDD) communication bands and Long Term Evolution (LTE) frequency division duplex (FDD) communication bands in a cellular telecommunications network.

12. The apparatus of claim 1, further comprising: wherein the apparatus is a cellular telephone handset configured to operate in diverse geographical regions having diverse communication bands available.

13. An apparatus, comprising: a tunable duplexer selectively connected to an antenna, configured to transmit and receive radio frequency communication signals in a group of at least two bands; a tunable transmit filter in the duplexer, capable of being tuned to have an inductance value approximately matching at least two inductance values corresponding respectively to pass the at least two bands in the group, each of the at least two bands in the group having a positive duplex offset and each of the at least two inductance values that correspond respectively to the at least two bands in the group, having an inductance value that approximately matches the inductance values corresponding respectively to the other bands in the group; a second tunable duplexer selectively connected to the antenna, configured to transmit and receive radio frequency communication signals in a second group of at least two bands, the second duplexer comprising a tunable transmit filter capable of being tuned to have an inductance value approximately matching at least two inductance values corresponding respectively to pass the at least two bands in the second group, each of the at least two bands in the second group having a positive duplex offset and each of the at least two inductance values that correspond respectively to the at least two bands in the second group, having a higher inductance value than the inductance value in the first said group, which approximately matches the inductance values corresponding respectively to the other bands in the second group; a location determination module in the apparatus, configured to determine a current geographical region for the apparatus, in which regional radio frequency communication bands are known to be available in the current geographical region; and a processor in the apparatus, coupled to the location determination module and the tunable duplexer, configured to provide control signals to adjust band pass characteristics at least the tunable transmit filter in the tunable duplexer, based on the regional radio frequency communication bands known to be available in the determined current geographical region.

14. The apparatus of claim 13, further comprising: wherein the location determination module in the apparatus, is at least one of a user interface or a global position system (GPS) receiver, configured to receive data identifying a current geographical region for the apparatus; and the processor in the apparatus, is configured to download the known available regional radio frequency communication bands for the current geographical region, from a remote server.

15. A method, comprising: determining, by an apparatus, that a first plurality of bands of radio frequency communication and a second plurality of bands of radio frequency communication are available for wireless communication in a current geographical region; determining, by the apparatus, that communication signals in a group of at least two bands of the first plurality of bands, are capable of being passed by a tunable transmit filter of a first tunable duplexer, based on the tunable transmit filter being tuned to have an inductance value approximately matching at least two inductance values corresponding respectively to the group of at least two bands of the first plurality; determining, by the apparatus, that communication signals of at least two bands of the second plurality of bands, are capable of being passed by a second tunable transmit filter of a second tunable duplexer, based on the second tunable transmit filter being tuned to have an inductance value approximately matching at least two inductance values corresponding respectively to the at least two bands of the second plurality; connecting, by the apparatus, the at least two bands of the first plurality of bands, to the first tunable duplexer and the at least two bands of the second plurality of bands, to the second tunable duplexer; and wherein the second tunable duplexer is configured to transmit and receive radio frequency communication signals in a second group of at least two bands, the second duplexer comprising a tunable transmit filter capable of being tuned to have an inductance value approximately matching at least two inductance values corresponding respectively to pass the at least two bands in the second group, each of the at least two bands in the second group having a positive duplex offset and each of the at least two inductance values that correspond respectively to the at least two bands in the second group, having a higher inductance value than the inductance value in the first said group, which approximately matches the inductance values corresponding respectively to the other bands in the second group.

16. The method of claim 15, further comprising: wherein the bands are at lest one of Universal Mobile Telecommunications System (UMTS) frequency division duplex (FDD) communication bands and Long Term Evolution (LTE) frequency division duplex (FDD) communication bands in a cellular telecommunications network; and wherein the apparatus is a mobile telephone handset configured to operate in diverse geographical regions having diverse communication bands available.

17. A computer program product comprising computer executable program code recorded on a computer readable, non-transitory storage medium, the computer executable program code comprising: code for determining, by an apparatus, that a first plurality of bands of radio frequency communication and a second plurality of bands of radio frequency communication are available for wireless communication in a current geographical region; code for determining, by the apparatus, that communication signals in a group of at least two bands of the first plurality of bands, are capable of being passed by a tunable transmit filter of a first tunable duplexer, based on the tunable transmit filter being tuned to have an inductance value approximately matching at least two inductance values corresponding respectively to the group of at least two bands of the first plurality; code for determining, by the apparatus, that communication signals of at least two bands of the second plurality of bands, are capable of being passed by a second tunable transmit filter of a second tunable duplexer, based on the second tunable transmit filter being tuned to have an inductance value approximately matching at least two inductance values corresponding respectively to the at least two bands of the second plurality; code for connecting, by the apparatus, the at least two bands of the first plurality of bands, to the first tunable duplexer and the at least two bands of the second plurality of bands, to the second tunable duplexer for wireless communication by the apparatus in the current geographical region; and wherein the second tunable duplexer is configured to transmit and receive radio frequency communication signals in a second group of at least two bands, the second duplexer comprising a tunable transmit filter capable of being tuned to have an inductance value approximately matching at least two inductance values corresponding respectively to pass the at least two bands in the second group, each of the at least two bands in the second group having a positive duplex offset and each of the at least two inductance values that correspond respectively to the at least two bands in the second group, having a higher inductance value than the inductance value in the first said group, which approximately matches the inductance values corresponding respectively to the other bands in the second group.

18. The apparatus of claim 1, further comprising: a tunable receive filter in the duplexer, capable of being tuned to have an inductance value approximately matching at least two inductance values corresponding respectively to pass receive frequency signals of the at least two bands in the group.

* * * * *